United States Patent
Tong et al.

(10) Patent No.: US 8,650,464 B1
(45) Date of Patent: Feb. 11, 2014

(54) SYMMETRIC DIAGONAL INTERLEAVING AND ENCODING/DECODING CIRCUIT AND METHOD

(75) Inventors: Po Tong, Los Altos, CA (US); Ivana Djurdjevic, Cupertino, CA (US); Damien Latremouille, Ottawa (CA); Francesco Caggioni, Winchester, MA (US); Dariush Dabiri, San Jose, CA (US)

(73) Assignee: Applied Micro Circuits Corporation, Sunnyvale, CA (US)

( * ) Notice: Subject to any disclaimer, the term of this patent is extended or adjusted under 35 U.S.C. 154(b) by 165 days.

(21) Appl. No.: 13/225,337

(22) Filed: Sep. 2, 2011

Related U.S. Application Data

(60) Provisional application No. 61/380,692, filed on Sep. 7, 2010.

(51) Int. Cl.
*H03M 13/00* (2006.01)
(52) U.S. Cl.
USPC ............................ 714/776; 714/779; 714/807
(58) Field of Classification Search
USPC ........................ 714/776, 779, 752, 777, 804
See application file for complete search history.

(56) References Cited

U.S. PATENT DOCUMENTS

| 4,559,625 | A | 12/1985 | Berlekamp et al. | |
|---|---|---|---|---|
| 6,938,196 | B2 * | 8/2005 | Richardson et al. | 714/752 |
| 7,133,853 | B2 * | 11/2006 | Richardson et al. | 706/15 |
| 7,395,490 | B2 * | 7/2008 | Richardson et al. | 714/779 |

OTHER PUBLICATIONS

U.S. Appl. No. 61/380,692, pp. 18.
"100G Ultra Long Haul DWDM Framework Document", believed to be published before Sep. 2, 2011 at http://www.oiforum.com/public/documents/OIF-FD-100G-DWDM-01.0.pdf, pp. 10.

* cited by examiner

*Primary Examiner* — Fritz Alphonse
(74) *Attorney, Agent, or Firm* — Turocy & Watson, LLP

(57) ABSTRACT

A circuit and method form a codeword including parity and message bits, as follows. Each codeword has a first part in a current sequence (e.g. a current OTN-row) that is to be now transmitted and second part spread across multiple past sequences (e.g. previously prepared and transmitted OTN-rows). The codewords are grouped into multiple groups such that each codeword within a group has no bit in common with another codeword in that group. Moreover, each codeword has a bit in common with a different codeword in a different group.

17 Claims, 17 Drawing Sheets

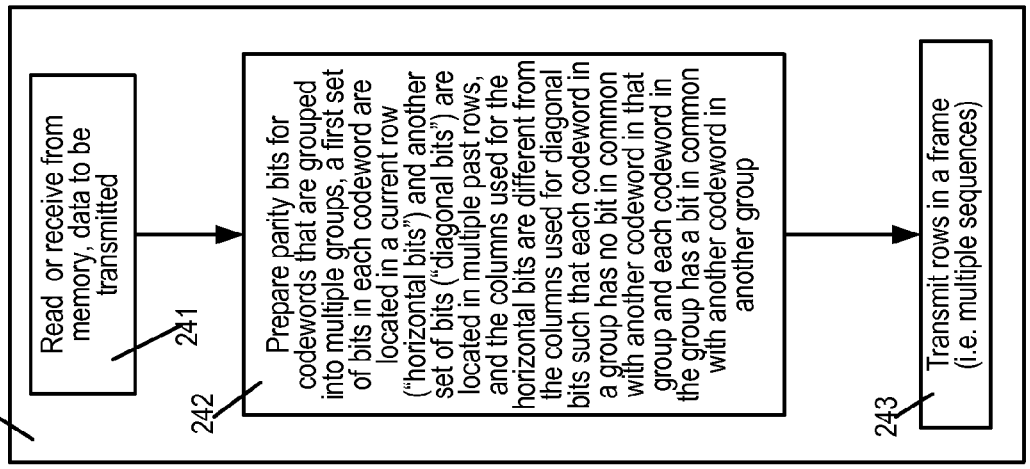
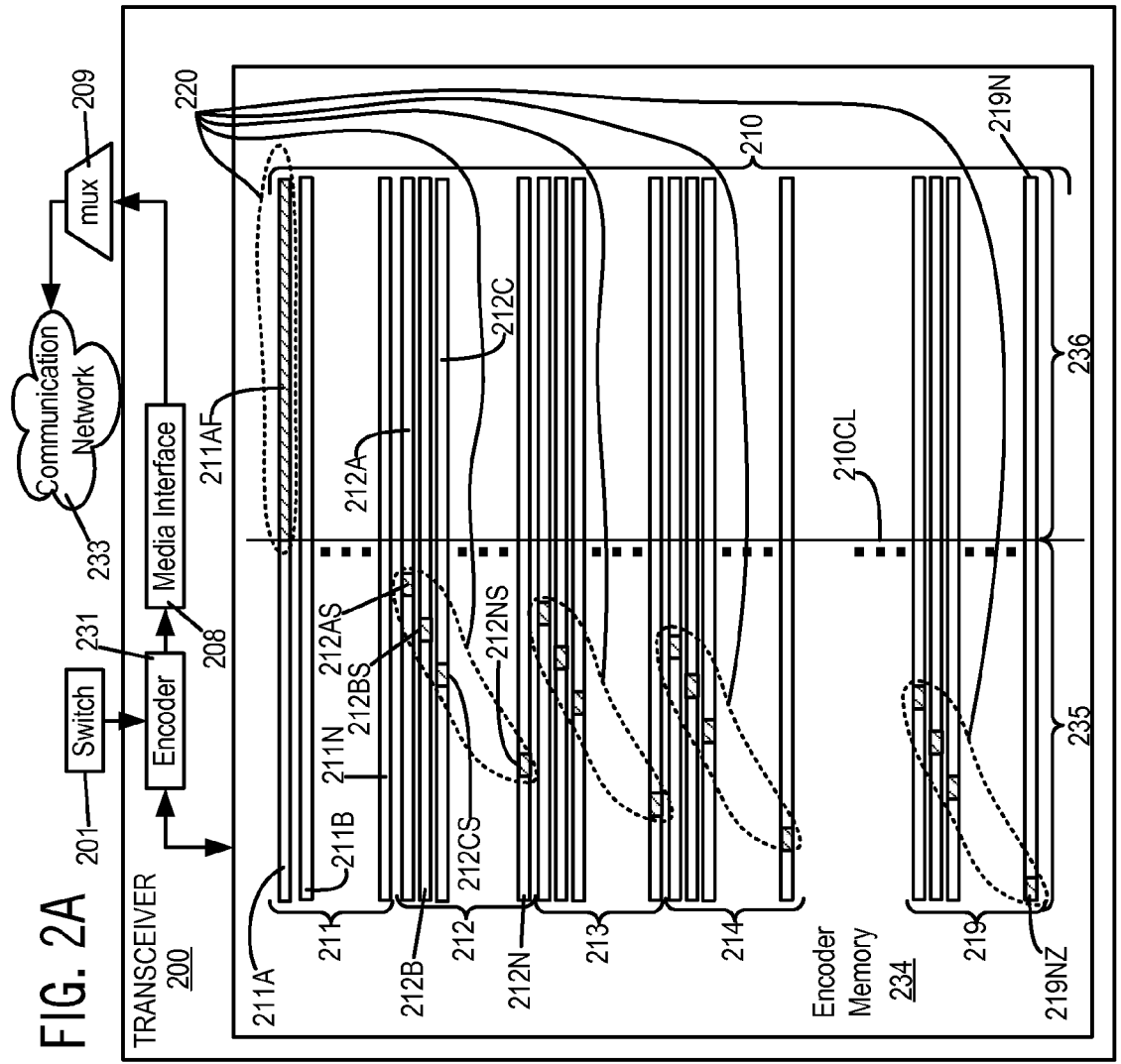

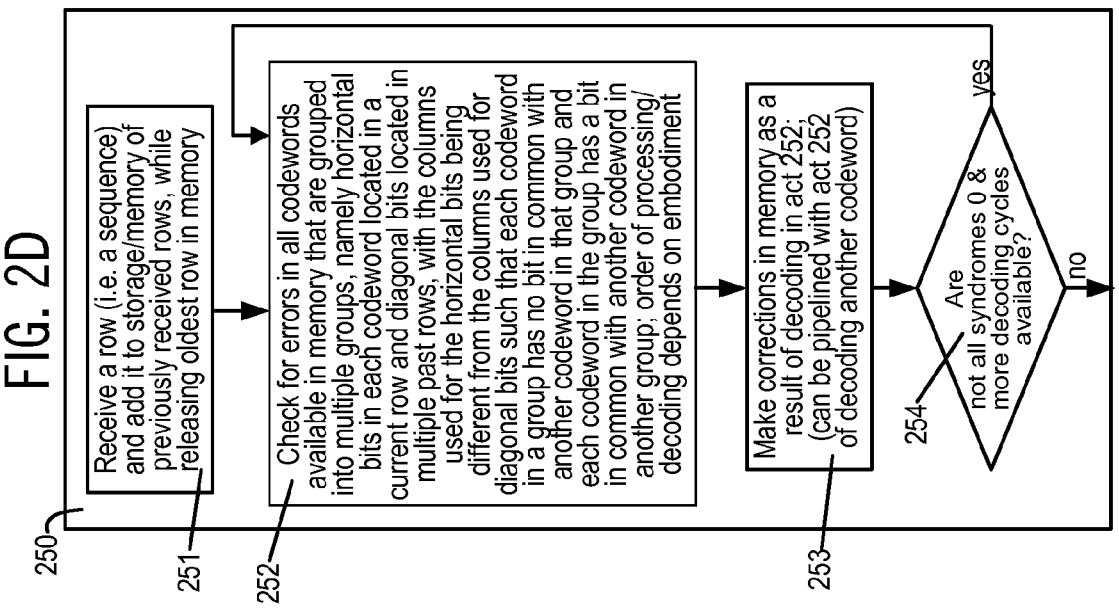
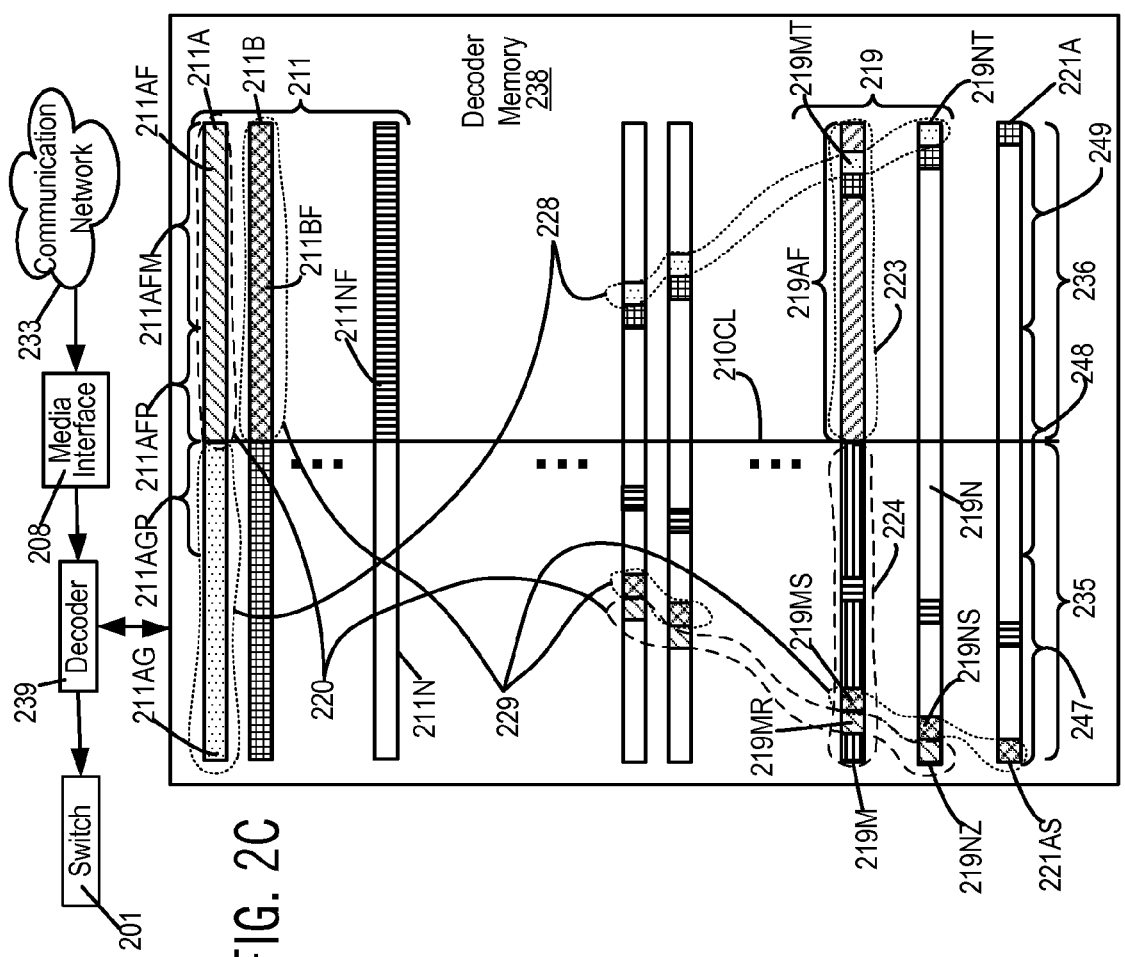

FIG. 5C

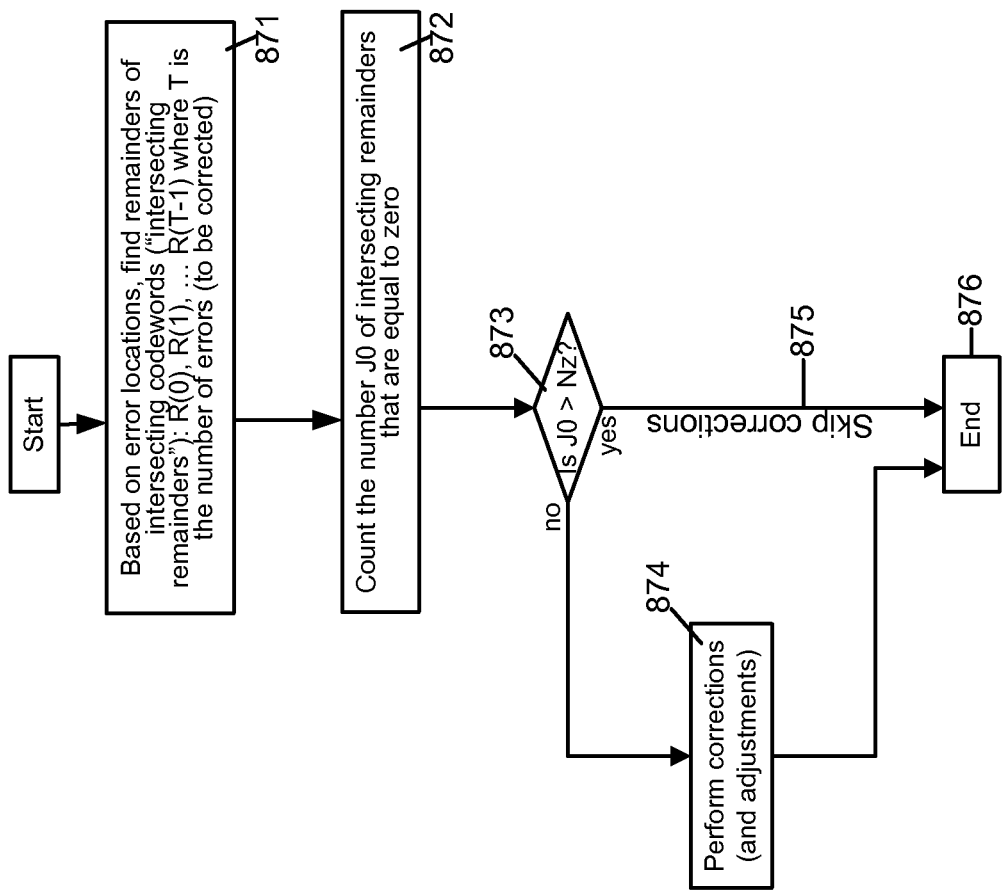

SYMMETRIC DIAGONAL INTERLEAVING AND ENCODING/DECODING CIRCUIT AND METHOD

CROSS-REFERENCE TO PROVISIONAL APPLICATION

This application claims priority under 35 USC §119 (e) from a provisional application, namely U.S. Application No. 61/380,692 filed on Sep. 7, 2010 having the title "Symmetric Diagonal Interleaving", filed by Po Tong et al, which is incorporated by reference herein in its entirety.

BACKGROUND

In certain prior art communication networks, data is transferred between elements ("network elements") in the form of frames in accordance with an interface for an optical network, such as "Network Node Interface for Optical Transport Network (OTN)" as defined in the ITU-T Recommendation G.709. One such prior art frame 10 (illustrated in FIG. 1A) has four rows 11-14. Each of rows 11-14 has an overhead bytes (e.g. 16 bytes), payload bytes (e.g. 3808 bytes) and error correction bytes (e.g. 256 bytes).

Typically, the error correction bytes are prepared by a well-known scheme, such as a Reed-Solomon (RS) code, wherein 16 bytes of parity are added for every 239 bytes of data. Such an OTN row 11 may be stored or prepared, and transmitted sequentially by columns in a two-dimensional array. For example, as illustrated in FIG. 1B, initial bytes 1-16 are stored in a column 15, followed by bytes 17-32 being stored in column 16, and so on. The bytes of OTN row 11 are supplied sequentially by array rows, to an FEC encoder/decoder. For example, in the array shown in FIG. 1B, a data group 22 in the top-most row 21 has 239 bytes and these bytes are encoded/decoded using 16 bytes in parity group 23 also located in top-most array row 21.

The above-described method for transmission/receipt by columns and encoding/decoding by rows may be accomplished by use of an interleaver of the type described in U.S. Pat. No. 4,559,625 granted to Berlekamp et al, entitled "Interleavers for digital communications" incorporated by reference herein in its entirety as background. As stated therein, it is well known in the art to interleave block codes to exploit helical symmetry, in data that is transmitted and received in a communications network. However, such a prior art helical interleaver with single level coding is too inefficient for modern communications. Here, by single level coding we mean that every bit is protected by a single codeword or equivalently every bit belongs to only one codeword. Hence, the inventors believe an improved interleaving and corresponding encoding/decoding circuit and method is needed, as described below.

SUMMARY

In several aspects of the invention, a circuit and method prepare sequences of bits to be transmitted, by computing parity over message bits of codewords and the computed parity bits are included in the codewords. Each codeword is configured to have a first set of bits ("horizontal part") in a current sequence and a second set of bits ("diagonal part") in multiple past sequences. The codewords can be grouped into multiple groups such that each codeword in a group has no bit in common with another codeword in that group, and each codeword in a group has a bit in common with another codeword in another group.

A circuit and method that receive such sequences of bits identify the bits of each codeword based on the above-described configuration. The two sets of bits of each codeword, i.e. horizontal part and diagonal part together constitute the combination of parity bits and message bits (wherein the message bits include overhead bits and payload bits). In some aspects of the invention, the parity bits of a current codeword are included in the first set of bits, as a subset of the horizontal part of the current codeword, although in other aspects of the invention a current codeword's parity bits are included in the second set of bits of another codeword. Furthermore, every current codeword's bit in the first set of bits is included in the second set of bits of another codeword from another group, so that every bit is protected by two codewords in several embodiments of the invention.

Use of two part codewords arranged into two or more groups as described above has several advantages. Specifically, grouping of the type described above minimizes probability of decoder failure and optimizes the decoder latency. Moreover, receipt of a current row which provides the first set of bits ("horizontal part") enables the entire codeword to be decoded at the current time, by use of the second set of bits ("diagonal part") which has been already received, in the one or more previously received rows.

BRIEF DESCRIPTION OF THE FIGURES

FIG. 2A illustrates, in a high-level block diagram, a transceiver 200 including an optional storage memory 234, and a configuration of codewords (one of the codewords is codeword 220) in two groups of columns 235 and 236 in an array 210 that is used by an encoder 231 in accordance with the invention.

FIG. 2B illustrates, in a high-level flow chart, a method 240 that is performed by encoder 231, to form the configuration of codewords of FIG. 2A.

FIG. 2C illustrates, in a high-level block diagram, transceiver 200 of FIG. 2A including memory 238 that stores the configuration of codewords being decoded by a decoder 239 in accordance with the invention.

FIG. 2D illustrates, in a high-level flow chart, a method 250 that is performed by a decoder 239, to decode the codeword 220 of FIG. 2A.

FIG. 5C is used to illustrate parity computation in the alternative configuration of the toy example of FIG. 4A.

FIG. 8C illustrates, in a flow chart, certain acts in addition to FIG. 8B, for each decoder of the type shown in FIG. 9, in several aspects of the invention.

DETAILED DESCRIPTION

Figure 1A:
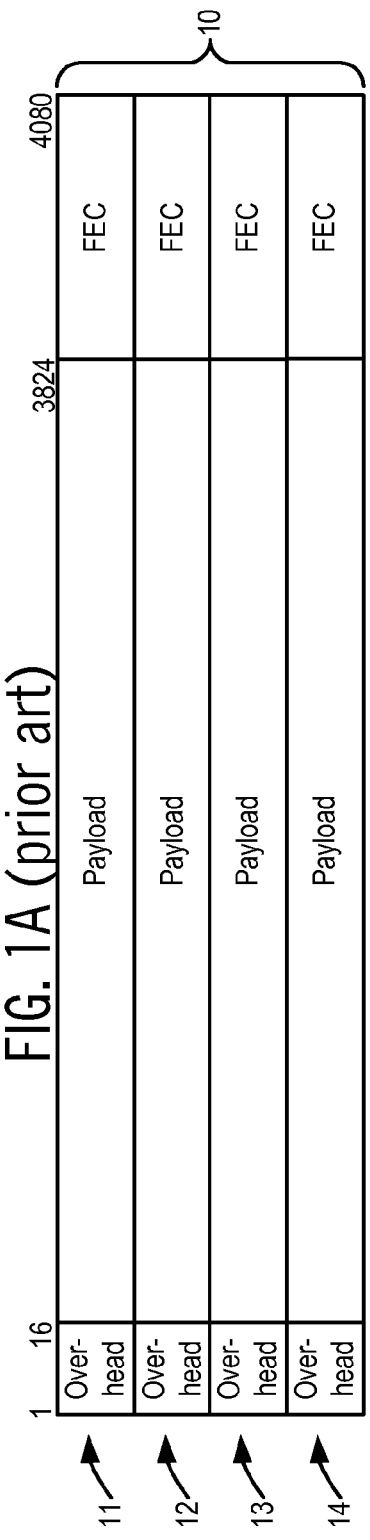
FIG. 1A illustrates a layout of bytes in a frame used to transfer data in certain prior art communication networks.
Figure 1B:
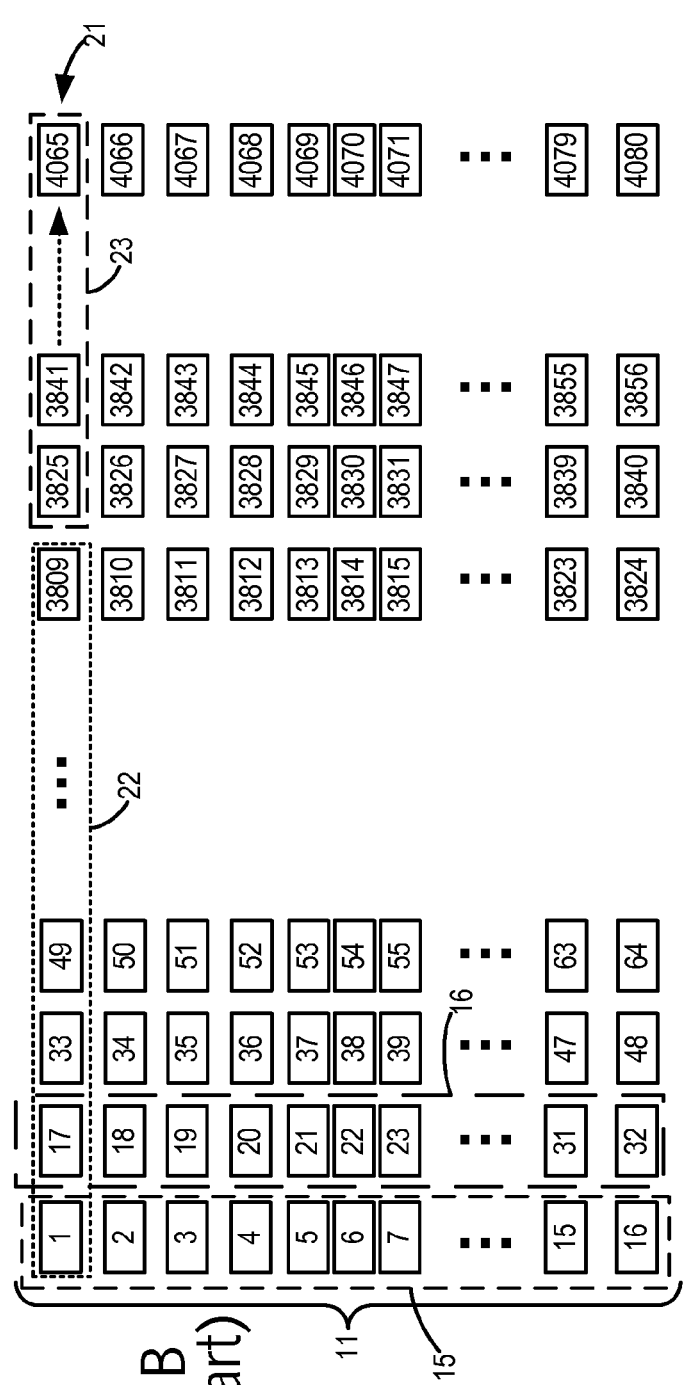
FIG. 1B illustrates prior art column-by-column storage or configuration in a two-dimensional array, of a row of the frame of FIG. 1A.

In several aspects of the invention, a circuit and method prepare sequences of bits to be transmitted, by forming codewords. As used herein, the term "codeword" includes two kinds of bits, namely message bits and parity bits. Message bits in accordance with the invention and in some applications, e.g. OTN, can include overhead bits and payload bits. Overhead bits are used in the normal manner, e.g. to identify the payload's position relative to start of frame, and/or for status and/or for control. Payload bits in accordance with the invention carry user data.

An error correcting algorithm is applied, to the just-described message bits, to compute parity bits, e.g. by use of constituent codes of the type readily apparent to the skilled artisan in view of this detailed description. A specific coding technique that is used to compute parity bits can be different in different embodiments. In many embodiments, parity bits are appended to message bits which are kept unchanged, and these parity bits are computed using a "systematic" code in the coding technique. In several such embodiments, the systematic code is chosen to be a "linear" code that is "cyclic", for ease in concurrently creating parity bits, as message bits are being received and transmitted. In some illustrative embodiments, a Bose-Chaudhuri-Hocquenghem (BCH) technique is used to compute parity bits, and one such example is the Reed Solomon (RS) code, generated using a pre-selected polynomial.

Regardless of how computed, parity bits and message bits together constitute a codeword (also called "code word") in accordance with the invention. An illustrative codeword 220 (FIG. 2A) is formed within a transceiver 200, by an encoder 231 included therein performing a method 240 to compute parity bits by using message bits, as described above. Specifically, in act 241 (FIG. 2B), encoder 231 receives or reads to-be-transmitted data as message bits from a switch 201, and optionally stores them temporarily in a memory 234 (also called "encoder memory"). Thereafter, in act 242, encoder 231 prepares parity bits and concatenates them with message bits (e.g. after a last message bit) to form a codeword 220 that has two sets of bits described in detail below.

In some embodiments, encoder 231 transmits message bits received from switch 201 directly to media interface 208 (FIG. 2A) and also concurrently prepares parity bits using the message bits being received, thereby reducing storage requirements. In such embodiments, after one or more parity bits are prepared, and after a certain number of message bits have been processed and transmitted to media interface 208, transmission begins of prepared parity bits thereby to append the parity bits to the message bits.

Figure 9:
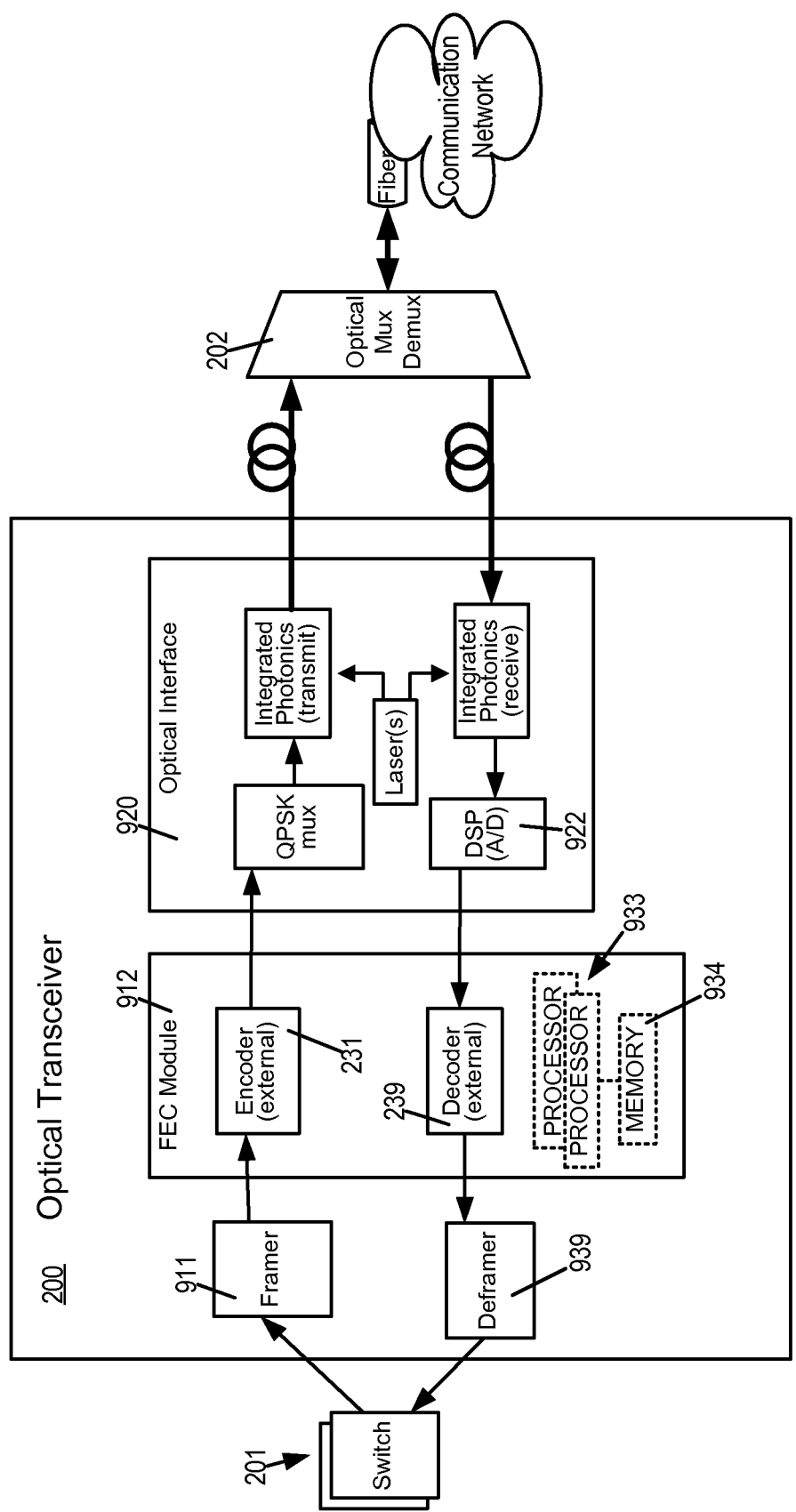
FIG. 9 illustrates, in a high level block diagram, use of the encoder 231 and decoder 239 of FIGS. 7 and 8A respectively in an optical transceiver 200 in an illustrative example in accordance with the invention.

Specifically, the message and parity bits are received and used by media interface 208 to modulate (or otherwise prepare) a signal (such as an electrical signal or a light signal) that can be transmitted on a communication medium (such as an electrical cable or an optical fiber). Therefore, interface 208 transmits an appropriate signal to communication network 233 (e.g. via a multiplexer 209). Media interface 208 can be implemented differently in different embodiments, and one illustrative implementation is shown in FIG. 9 as optical interface 920 (described below).

Note that parity bits are not necessarily appended to message bits in certain alternative embodiments, wherein a coding technique used to compute parity need not use a linear code, and instead uses a non-linear code. And, several other alternative embodiments do not use a systematic code, and instead a codeword is constituted of bits that include parity and message information in any combination and formed in any manner apparent to the skilled artisan in view of this detailed description. Therefore depending on the embodiment, any one of the four combinations can be used: linear and systematic, or linear and non-systematic, or non-linear and systematic or non-linear and non-systematic.

In some embodiments, a first set of bits of codeword 220 are located relative to one another in a sequence of bits (also called "row") 211. Sequence (or row) 211 has numerous bits in addition to the first set bits, and a specific placement of the first set bits among the bits of sequence (or row) 211 can be different depending on the aspect of the invention. In an example illustrated in FIG. 2A, sequence 211 is shown stored in an encoder memory 234 in a two-dimensional array 210 that has multiple rows ("array rows").

Although in FIG. 2A, array 210 is shown as being formed by storage locations in a memory 234 of some embodiments, as will be readily apparent to the skilled artisan (in view of this detailed description) array 210 need not be physically present in a memory 234 accessible to encoder 231. Specifically, in certain embodiments array 210 is a generic representation of a configuration (or arrangement) that is used in accessing data for use in encoding or decoding in accordance with the invention. For this reason, locations within two-dimensional array 210 are also referred to below as storage locations or alternatively as configuration locations.

In FIG. 2A, storage or configuration locations in array rows 211A-211N hold sequence 211, and similarly storage or configuration locations in array rows 212A-212N hold sequence 212. The number of array rows that are used in encoder memory 234 to hold a single sequence i.e. a single row, depends on the aspect of the invention. In one illustrative example, each sequence is stored in thirty two array rows.

Array 210 has a number M of columns ("array columns") in memory 234 (or in a configuration for encoding/decoding of data) that are grouped in accordance with this invention, into multiple groups for use in encoding codewords. Specifically, in some aspects of the invention illustrated in FIG. 2A, array columns 235 located to the left of a center line 210CL passing through array 210 form a left group of columns while array columns 236 located to the right of the center line 210CL form a right group of columns. In several aspects of the invention, the number M is predetermined to be even. Hence, the number of left columns 235 in array 210 is identical to the number of right columns 236 in array 210, and both numbers are M/2.

In an illustrative example, codeword 220 has 1020 bits, and for this reason the number M is selected to be 1020, so that half of this number, i.e. 510 columns in the left half of array 210 constitute a left group. Similarly, 510 columns in the right half of array 210 constitute the right group. In one such example, a single sequence 211 occupies 32 array rows, with each array row holding 1020 bits within the 1020 columns in the left and right halves of array 210.

In an aspect of the invention illustrated in FIG. 2A, the above-described first set bits of codeword 220 are placed into right columns 236, in a top-most array row 211A in the two-dimensional array 210, specifically at locations 211AF in memory 234 (or in a configuration for encoding/decoding, as noted above). In this example, first set bits 211 AF of codeword 220 are also called "horizontal bits" or "horizontal part" by virtue of being predetermined to be located within a single array row 211A in FIG. 2A. However, depending on the aspect of the invention, the first set bits of a codeword can be predetermined to be located in any one or more of the multiple array rows 211A-211N that hold sequence 211.

A second set of bits of codeword 220 are drawn from (i.e. occur in) multiple sequences that temporally precede sequence 211, such as past sequences 212-219. Specifically, sequences 212-219 that hold the second set bits are transmitted (and hence received) through a communications network 233 before sequence 211 that holds the first set bits. Accordingly, codeword 220 is formed by encoder 231 to use from one past sequence 212, several second set bits in locations 212AS, 212BS, 212CS . . . 212NS of the respective array rows 212A, 212B, 212C, . . . 212N. Similarly, additional second set bits of codeword 220 occur in past sequences 213, 214 and 219.

Note that the second set bits of codeword 220 are predetermined to be not placed in a single column of the two-dimensional array 210. Also, the second set bits of codeword 220 are not all predetermined to be placed in a single row of the two-dimensional array 210. Instead, in some aspects of the invention, the second set bits used in encoding the codeword 220 are obtained from (i.e. occur in) diagonal locations of a subset of rows and columns of the two-dimensional array 210. In such a configuration, the second set bits, which are located on or adjacent to a diagonal of array 210, are also referred to as "diagonal bits" or "diagonal part." However, depending on the aspect of the invention, the second set bits of a codeword 220 can be obtained, using any pre-selected orientation (relative to one another) in any pre-selected configuration, from among the multiple rows of array 210 other than rows 211A-211N that hold the first sets of bits. Also depending on the aspect of the invention, the second set bits of a codeword can be obtained using any pre-selected configuration, from among multiple columns of array 210 other than right columns 236 that hold first sets of bits.

To re-iterate, codeword 220 is configured by an encoder 231 in accordance with the invention, such that right array columns 236 from which first set bits 211AF are obtained for encoding are different from left array columns 235 from which the second set bits (such as bits 212AS-212NS) are obtained for encoding. In the example shown in FIG. 2A, first set bits 211AF are present in array columns 236 located in the right half of the above-described two-dimensional array 210, and second set bits of codeword 220 are present in array columns 235 located in the left half of the two-dimensional array 210.

A specific pre-selected configuration that is used to obtain the bits of one codeword 220 is repeatedly used by encoder 231 to obtain bits for multiple codewords, from corresponding multiple additional sequences of data. All such codewords obtain their first set bits from right columns 236 and their second set bits from left columns 235, as illustrated in FIG. 2C. For example, another codeword 229 (shown cross-hatched in FIG. 2C) is formed by first set bits 211BF in right columns 236 in array row 211B, and second set bits in left columns 235, such as bit 219MS in array row 219M, bit 219NS in array row 219N and bit 221AS in array row 221A.

Note that array row 221A happens to be storing the bits of an earlier frame that precedes a frame that is stored in rows 211-219. Encoder 231 of some embodiments is designed to operate independent of a boundary between frames. In such embodiments, encoder 231 operates at a row level. Hence, encoder 231 prepares rows 221 and 219, in exactly the same manner relative to each other, even though a frame boundary occurs between these two array rows.

In addition to forming a group of right codewords, encoder 231 is further designed to form another group ("left group") of codewords (called "left" codewords), by using a mirror-image of the above-described specific pre-selected configuration for forming right codewords. Hence, encoder 231 forms multiple left codewords all of which have their horizontal bits (i.e. horizontal part) stored in left columns 235 and their diagonal bits (i.e. diagonal part) stored in right columns 236. For example, a left codeword 228 (in storage locations or configuration locations), filled with a dot pattern in FIG. 2C) is formed by horizontal bits in locations 211 AG within left columns 235, in a top-most array row 211A that holds a current sequence 211, and diagonal locations within right columns 236 hold the diagonal bits of earlier sequences, such as sequence 219. FIG. 2C shows a diagonal bit in storage location (or encoding/decoding configuration location) 219MT of array row 219M and the diagonal bit in storage location (or encoding/decoding configuration location) 219NT in array row 219N, and both these diagonal bits are included in a diagonal part of codeword 228.

All codewords that have horizontal bits in right columns 236 and diagonal bits in left columns 235 together form a group ("right group") of codewords that are also called "right" codewords. Encoder 231 is deliberately designed to ensure that each right codeword has no bit in common with another right codeword in several aspects of the invention. This requirement is met in the example illustrated in FIG. 2A, because in right columns 236, first set bits 211AF of right codeword 220 are present in one array row 211A while first set bits 211BF of right codeword 229 (described in the preceding paragraph) are present in a different array row 211B.

Similarly second set bits of right codeword 220 are offset by one array row from second set bits of right codeword 229. For example, an earliest-received bit 221AS of right codeword 229 is stored in array row 221A while a corresponding earliest-received bit 219NZ of right codeword 220 is stored in array row 219N although both are located in the left-most column among the left columns 235. To summarize, each codeword in a group of right codewords has no bit in common with another codeword in this group of right codewords.

The two groups of codewords (namely right codewords and left codewords) are prepared by encoder 231 as described above, to satisfy another requirement: each codeword in a group has a bit in common with another codeword in another group (and the just-described two codewords that have the bit in common are also referred to herein as "intersecting" codewords). As an example, a right codeword (not illustrated in FIG. 2C) having its horizontal bits located in array row 219M

(FIG. 2C) in right columns 236 shares a bit that is stored in storage location (or encoding/decoding configuration location) 219MT with a later codeword 228 (shown filled with a dot pattern in FIG. 2C) described in the preceding paragraph. Specifically, a bit in storage location (or encoding/decoding configuration location) 219MT of array row 219M is a horizontal bit of right codeword 223 (of which only a single portion in an array row is shown in FIG. 2C), and this same bit is also a diagonal bit of left codeword 228.

As another example, a left codeword 224 (FIG. 2C) having its horizontal bits stored in array row 219M (FIG. 2C) in left columns 235 shares a bit at storage location (or encoding/decoding configuration location) 219MS with a later-occurring right codeword 229. Additionally, the just-described left codeword 224 has another bit at storage location (or encoding/decoding configuration location) 219MR in common with another later-occurring right codeword 220. Accordingly, a codeword of a left group has multiple bits in common with corresponding multiple later-occurring codewords of a right group (i.e. multiple intersecting codewords), although note that only one bit of the left codeword is in common with each right codeword. In some aspects of the invention, exactly one bit of each codeword in a right group is in common with exactly one codeword in a left group, and vice versa.

In some aspects of the invention, codeword 220 includes parity bits in the first set of bits e.g. in storage locations (or encoding/decoding configuration locations) 211AF, although in alternative aspects of the invention, parity bits may be included in second set of bits e.g. in storage locations (or encoding/decoding configuration locations) 212AS, 212BS, 212CS and 212NS. An advantage of including parity bits in the first set of bits 211 AF is that parity can be partially computed by encoder 231 one row at a time, using each set of second set bits that occur in that one row. By the time encoder 231 starts to work on a current row 211, the parity computation is partially completed, except for message bits (e.g. at storage locations or encoding/decoding configuration locations 211AFM in FIG. 2C) in current row 211. This eliminates need for storage, i.e. encoder memory. Such an encoder 231 still forms codewords based on encoding/decoding configuration 210, however data being encoded/decoded need not be stored in this configuration in memory.

After message bits 211AFM in current row 211 are used in parity computation, the resulting parity bits are then placed in current row 211, for example in storage locations (or encoding/decoding configuration locations) 211AFP. In the example illustrated in FIG. 2C, parity bits 211AFP for right codeword 220 are located adjacent to center line 210CL, in the left-most columns among right columns 236. Similarly, parity bits for left codeword 228 (see FIG. 2C) are computed and placed in storage locations (or encoding/decoding configuration locations) 211AGP adjacent to center line 210CL, in the right-most columns among left columns 235.

Hence, in FIG. 2C, the parity bits for codewords 220 and 228 are located in columns that are central to array 210, e.g. in storage locations (or encoding/decoding configuration locations) 211AFP and 211AGP. Therefore, columns 248 that contain storage locations (or encoding/decoding configuration locations) 211AFP and 211AGP are sandwiched between columns 247 located left-most among left columns 235, and columns 249 located right-most among right columns 236. Columns 248 are innermost columns relative to columns 247 and 249 that are outermost columns, of array 210.

In alternative aspects of the invention, parity bits of right codeword 220 may be placed in array row 211A at a maximum possible distance from center line 210CL, e.g. in the right-most columns of group 249 among right columns 236 while parity bits of left codeword 228 are also similarly placed distant from center line 210CL, e.g. in the left-most columns of group 247 among left columns 235.

In an act 243 (FIG. 2B), encoder 231 transmits sequences 211-219 (see FIG. 2A) within a frame to an element ("network element") in communication network 233. In this description we assume rows 211-219 form a frame transmitted in communication network 233. During transmission, each array 210 forming a frame is transmitted row by row, and each row is transmitted one column at a time. For example, bits in a right-most column of row 211 in right columns 236 are transmitted from a top-most array row 211A to a bottom-most array row 211N in sequence 211, followed by transmitting a left-most column in left columns 235 from the top-most array row 211A to the bottom-most array row 211N. Next, the just described process is repeated while excluding the columns that have been just transmitted (i.e. the two outer-most columns), until the two innermost columns are transmitted. Therefore the last two columns to be transmitted in each sequence (each row) are the right-most column in left columns 235 and the left-most column in right columns 235. Hence, the just-described last two columns are located adjacent to center line 210CL (which is accordingly located therebetween, i.e. between these last two columns).

In some aspects of the invention, network 233 is an optical transport network (OTN) and hence the frame conforms to an interface for an optical network, such as "Network Node Interface for Optical Transport Network (OTN)" as defined in the ITU-T Recommendation G.709. The frame is received by the network element, in a transceiver that includes a decoder 239 (FIG. 2C) and memory 238. The sequences that are received in such a frame (also called "OTN frame") can be stored in memory 238 one column at a time, as described above, in the preceding paragraph. Therefore, receipt of columns in each sequence alternates between a column in the left group 235 and a column in the right group 236. However, the actual memory organization suitable for implementation may be quite different than a data access configuration 238 shown in FIG. 2C. The data access configuration 238 gives an illustration of two groups of codewords and their organization into horizontal and diagonal sets of bits in some embodiments. Similar decoder architecture is easily extended and applied in other communication systems.

Decoder 239 (FIG. 2C) performs acts 251-254 illustrated by method 250 shown in FIG. 2D, using the exact same configuration of codeword 220 (not labeled in FIG. 2C, see FIG. 2A). Typically, decoder 239 receives sequences of bits from media interface 208. The sequences are present in frames of communication network 233 that are obtained by media interface 208 demodulating a light signal (or an electrical signal) received by, e.g. a photodiode or other such photonics, from an optical network (or from Ethernet).

Therefore, each of sequences 211-219 is retrieved from a frame (e.g. OTN frame) by decoder 239 in an act 251 (FIG. 2D), and the retrieved sequence (i.e. row) is stored in a memory (see "decoder memory" 238 in FIG. 2C) of previously received rows, while releasing an oldest row present in the memory 238. Next, in act 252, decoder 239 uses parity bits in the retrieved sequence to check for errors in all codewords available in memory 238 that are grouped into multiple groups of the type described herein. An order in which processing/decoding are performed in act 252 depends on the embodiment.

Next, in act 253, as a result of checking for errors (in act 252), one or more errors are identified and corrected in the bits stored in memory 238. After act 253, decoder 239 performs an act 254 to check if not all syndromes are zero, and whether more cycles of time are available for decoding and if so returns to act 252 (described above). Therefore, acts 252 and 253 can be repeated as many times as permitted by a time budget for doing so in a given implementation, with given system requirements. When the answer in act 254 is no, then decoder 239 transmits error-corrected data to switch 201 and then returns to act 251. Note that while error correction (e.g. forward error correction) is being performed in act 253 based on decoding of a current codeword, a next codeword can be concurrently decoded and used in error checking by act 252 (i.e. act 252 can be pipelined with act 253).

As noted above, decoder 239 accesses message and parity bits in each codeword, using the same configuration that was used by encoder 231 for transmission, as described above in reference to FIGS. 2A and 2B. In doing so, decoder 239 accesses two sets of bits in each codeword as follows: a first set bits in a current sequence and a second set bits in multiple past sequences, with one group of columns used for the first set of bits being different from another group of columns used for the second set of bits.

Moreover, as noted above in reference to encoder 231, the codeword configuration used by decoder 239 obtains two groups of codewords, e.g. left codewords and right codewords from the frames received via network 233 (FIG. 2A). As the same configuration is used, each left codeword in memory 238 (FIG. 2B) has no bit in common with any other left codeword, and additionally each right codeword shares multiple bits with corresponding multiple left codewords.

Although two groups of array columns namely left columns 235 and right columns 236 are illustrated in FIGS. 2A and 2B, any number of groups of array columns may be used depending on the aspect of the invention. Specifically, in some illustrative aspects of the invention, the columns of an array 300 (FIG. 3A) are grouped into four groups, namely left outer columns 310, left inner columns 320, right inner columns 330 and right outer columns 340. In the example illustrated in FIG. 3A, a set of columns in the left half of array 300 and a set of columns in the right half of array 300 are each used independent of one another, to hold codewords that are configured in each set similar to the codeword configuration described above in reference to array 210.

Figure 3A:
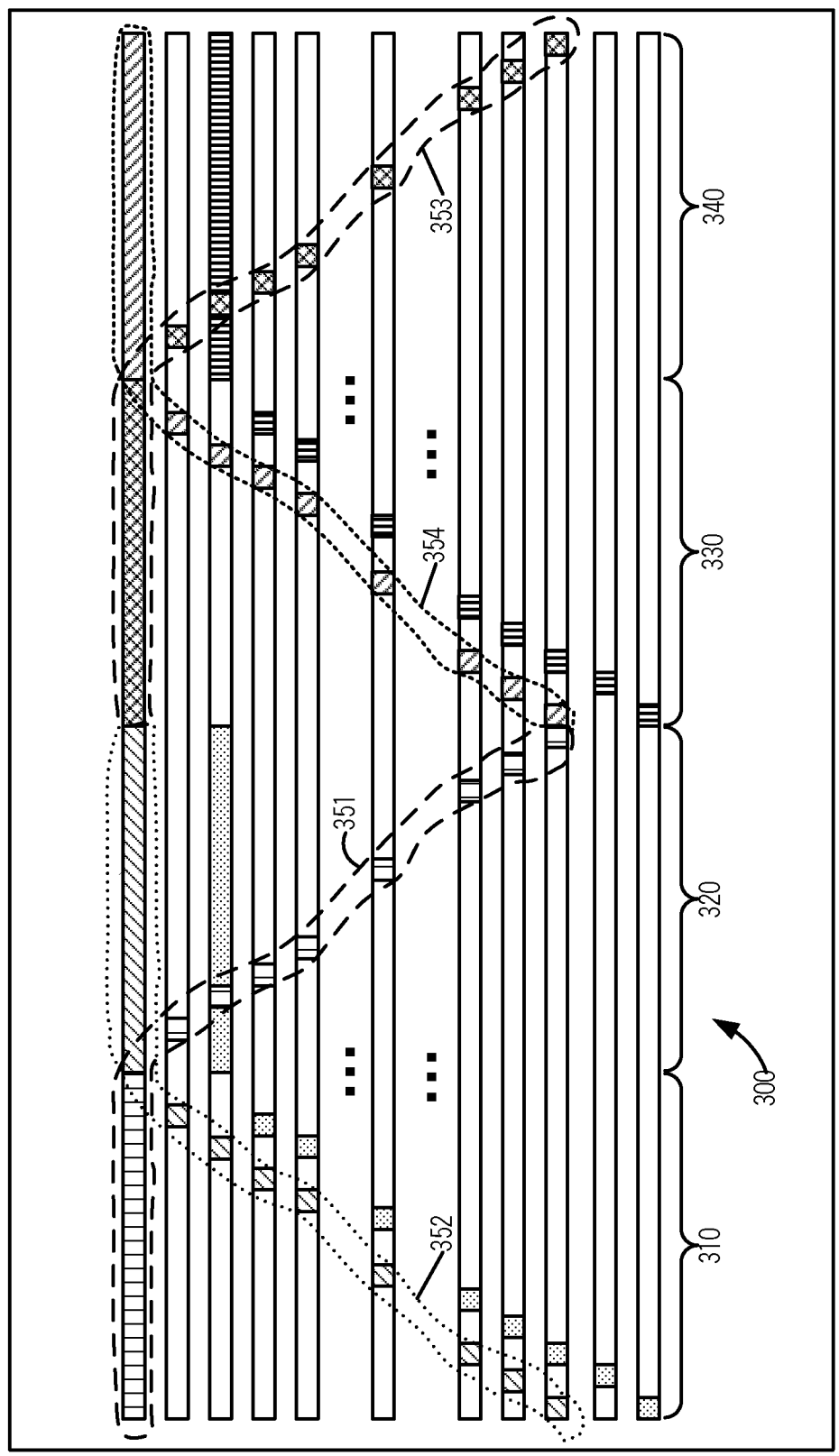
FIGS. 3A, 3B and 3C illustrate, in a memory 300, three alternative configurations of codewords, all three configurations using four groups of columns 310, 320, 330 and 340 in memory, in accordance with the invention.

Specifically, as shown in FIG. 3A, left half columns 310 and 320 of array 300 hold a codeword 351 that includes a horizontal part located in a single array row in left outer columns 310, with a diagonal part in left inner columns 320. Similarly, codeword 352 has its horizontal part located in left inner columns 320 and its diagonal part located in left outer columns 310. Additionally, right half columns 330 and 340 of array 300 are used in a manner similar to left half columns 310 and 320 of array 300. Specifically, codeword 353 has its horizontal part located in right inner columns 330 and its diagonal part located in right outer columns 340. Moreover, codeword 354 has its horizontal part located in right outer columns 340 and its diagonal part located in right inner columns 330.

In the examples illustrated in FIGS. 2A, 2C and 3A, an orientation of the diagonal part of a codeword in each group of columns is symmetric to (or a mirror image of) the orientation of a similar codeword in an adjacent group of columns. For example, in FIG. 3A, the diagonal part of codeword 352 is slanted between the top right corner and the bottom left corner across columns 310 while the diagonal part of codeword 351 is slanted in the opposite direction, between the top left corner and the bottom right corner across columns 320. However, in alternative aspects of the invention that may have implementation advantages, e.g. simpler to implement, the diagonal parts in all column groups 310, 320, 330 and 340 are slanted in a common direction relative to one another in the array locations, as described next.

Figure 3B:
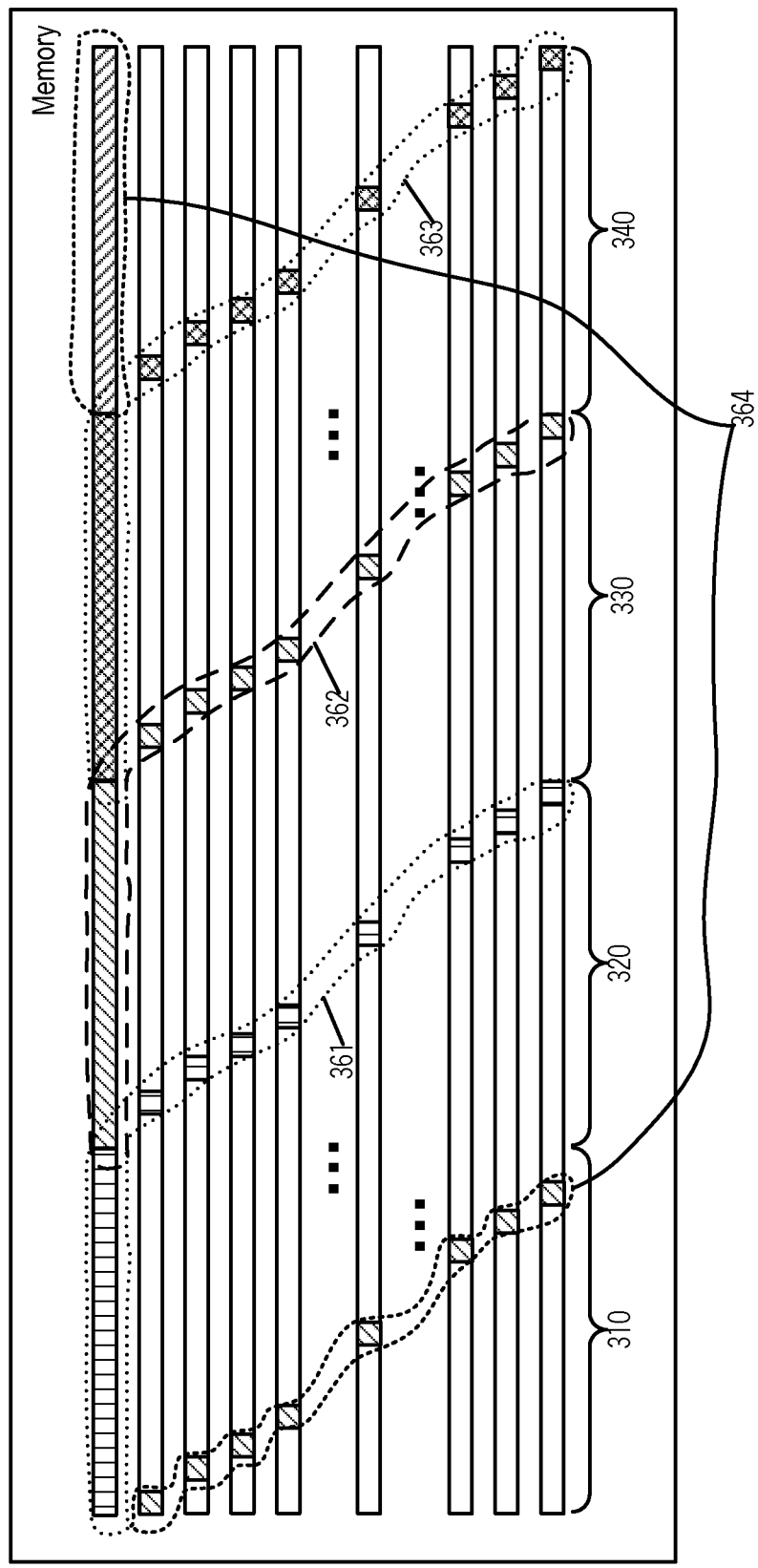

Specifically, in an example illustrated in FIG. 3B, codeword 361 has its diagonal part slanted between the top left corner and the bottom right corner across columns 320 while its horizontal part is stored in columns 310. Moreover, codeword 362 also has its diagonal part slanted between the top left corner and the bottom right corner across columns 330 while its horizontal part is stored in columns 320. Also, codeword 363 has its diagonal part slanted between the top left corner and the bottom right corner across columns 340 while its horizontal part is stored in columns 330. Finally, codeword 364 has its diagonal part slanted between the top left corner and the bottom right corner across columns 310 while its horizontal part is stored in columns 330.

Figure 3C:
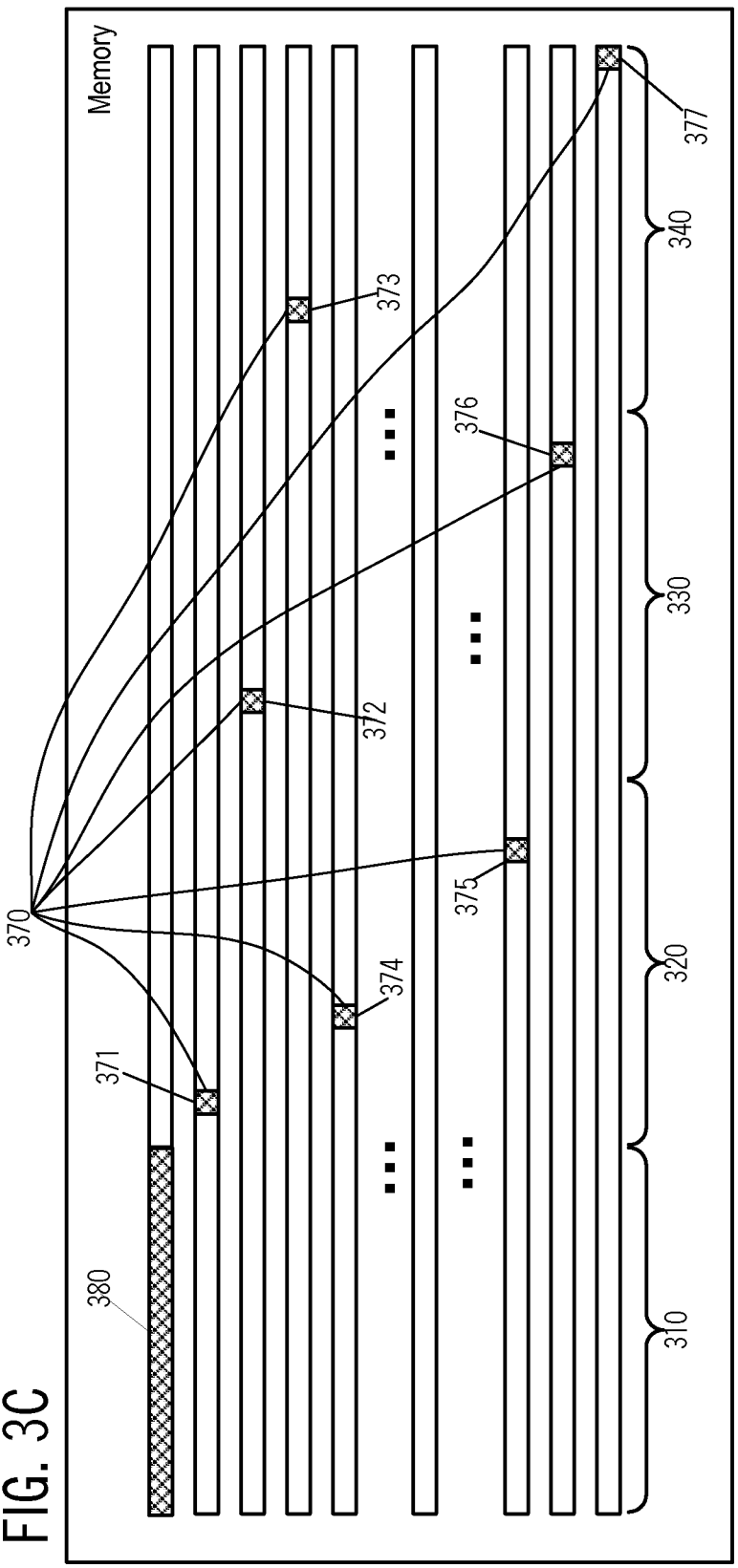

In the example described above in reference to FIG. 3B, the diagonal part of a codeword is shown located in a single group of columns. However, in alternative aspects of the invention, the diagonal part of each codeword is stored partially in each group of columns other than the group of columns that store the horizontal part. For example, in FIG. 3C, the codeword (not labeled) has a horizontal part in storage locations (or encoding/decoding configuration locations) 380 of an array row in column group 310 while the diagonal part 370 is located in each of groups 320, 330 and 340. Specifically, groups 320, 330 and 340 are used successively one after another in a round-robin fashion, to store successive bits 371-377 of the diagonal part 370. Hence, in the example of FIG. 3C, a codeword can be configured to use any two or more of four groups 310, 320, 330 and 340 to store one or more bits in the diagonal part of a codeword depending on the aspect of the invention. By placing diagonal bits into more or all other column groups, we effectively reduce the total number of rows that one codeword spans, i.e. the number of rows in which a codeword has participating bits. This reduces the memory requirements in the decoder as well as decoding latency, but results in less robust error correcting capabilities.

Figure 4A:
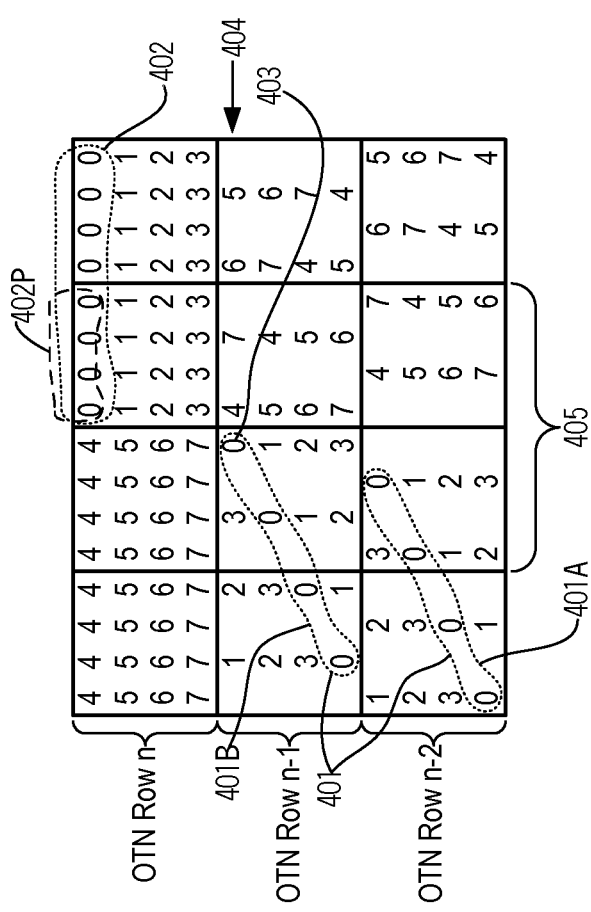
FIG. 4A illustrates, in a toy example, configuration of a codeword similar to the configuration illustrated in FIG. 2A.
Figure 4B:
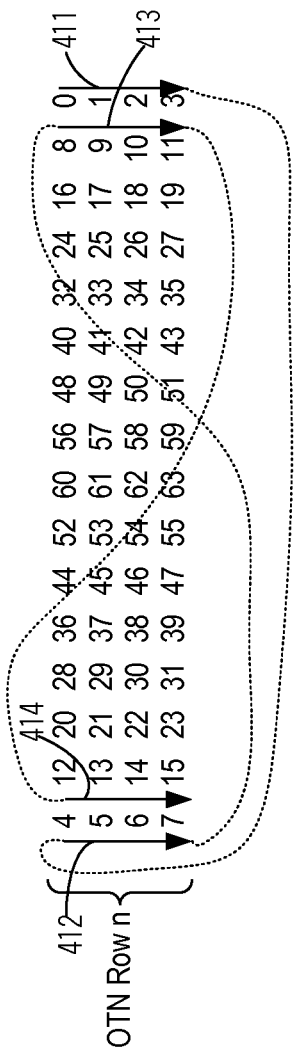
FIG. 4B illustrates a column-by-column transmission order for a sequence (OTN Row n) from the two-dimensional array of FIG. 4A.

Another example ("toy example") in accordance with this invention is illustrated in FIGS. 4A-4B and described next. Specifically, FIGS. 4A-4B illustrate a specific aspect of many embodiments which achieves high coding gain in excess of 9.4 dB at output BER of $10^{-15}$. The following description refers to an implementation at 40 Gbps for OTN, which has 127.5 cycles available per OTN row. Another description below provides an extension based on the 40 Gbps implementation, for a 100 Gbps implementation where only 63.75 cycles are available per row. The number of cycles available corresponds to clock frequency of 180 MHz and will be different for different clock frequencies.

The description herein using the example ("toy example") of FIG. 4A can be generalized and scaled to parameters of interest, by a skilled artisan in view of this disclosure. In the example illustrated in FIG. 4A, there are three toy-OTN rows shown, with toy-OTN row n being the most recent. There are eight codewords that are illustrated in FIG. 4A, identified by the numbers 0, 1, . . . , 7 in the diagram. Therefore, each codeword spans three toy-OTN rows in a toy example shown in FIG. 4A, starting at toy-OTN Row n−2, and terminating at toy-OTN Row n. In the toy example, codeword 0 is shown in FIG. 4A starting with a portion 401A in Row n−2. Each codeword in FIG. 4A consists of two parts, namely a diagonal part 401 and a horizontal part 402. The diagonal part 401 is located in a number of past toy-OTN rows, while the horizontal part 402 is located (or residing) in a single toy-OTN row, namely the current toy-OTN row. In the toy example of FIG. 4A, the diagonal part 401 includes two portions 401A and 401B that are oriented parallel to one another but located (or residing) in two different OTN rows, namely in toy-OTN Row n−1 and toy-OTN Row n−2.

Note that in a specific implementation for OTN itself, with an OTN row of a real-life example of the type defined in the ITU-T Recommendation G.709, each codeword actually spans 17 rows, with 16 rows used for each codeword's diagonal part and 1 row used for that codeword's horizontal part. Furthermore, in an actual implementation for OTN, each OTN row has 64 codewords, 32 left and 32 right codewords.

When a new toy-OTN row arrives, the value of n (which is a row identifier as shown in FIG. 4A) is updated to correspond to the current toy-OTN row. A new set of codewords are formed, with horizontal terminating parts residing in the current toy-OTN row, and the diagonal parts residing in the past two toy-OTN rows. In the codeword configuration shown in FIG. 4A, each bit resides in two codewords. It resides in the horizontal part of a codeword which terminates in the toy-OTN row it belongs. It also resides in the diagonal part of a codeword which terminates in a later toy-OTN row. For example bit 403 (FIG. 4A) resides in the horizontal part of a left codeword (not labeled) having a horizontal terminating part in array row 404 (not labeled). Moreover, the same bit 403 also resides in diagonal part 401 of codeword 0.

In the toy example shown in FIG. 4A, the parities (also called parity bits or parity check bits) are located at the innermost eight columns 405. Half of the parities belong to each of a left codeword and a right codeword. For example, the bits 402P in columns 405 are parity bits of codeword 0, located within horizontal part 402. Therefore, in the toy example of FIG. 4A, each codeword has length of 16 bits, with 12 message bits and 4 parity check bits.

In order to maximize burst correction capability, the bits of each toy-OTN row shown in FIG. 4A are transmitted through a channel to a communications network in the following order: column by column, outermost column first, alternating between columns between right and left halves (starting with outermost column on right half), and from top to bottom within each column. Note that the transmission order is shown in FIG. 4B for toy-OTN Row n, with each bit labeled in the order of transmission.

In FIG. 4B, initially bits 0, 1, 2, 3 of the right most column are transmitted as shown by arrow 411, followed by transmission of bits 4, 5, 6, 7 of the left most column as shown by arrow 412, and then bits 8, 9, 10, 11 adjacent to the right most column are transmitted as shown by arrow 413, followed by transmission of bits 12, 13, 14 and 15 adjacent to the left most column, as shown by arrow 414.

The toy example that is illustrated in FIGS. 4A and 4B is a special case of a configuration using symmetric diagonal interleaving ("SDI"), where the basic block length had been selected to be 4 bits. In the toy example of FIG. 4A, there are four blocks in each OTN row, and each block is 4×4 bits in size. In general, for an SDI configuration with basic block length of B bits, we have the following parameters.

(a) Number of codewords in each OTN row: 2B;
(b) Length of each codewords: $Nc=B^2$;
(c) Number of OTN rows spanned by the diagonal part of a codeword: B/2; and
(d) Burst correction capability: $B^2t$ where t is the error correction capability of the code.

In one specific illustrative embodiment relevant for real-life OTN applications, the basic block length is B=32. Therefore, in the just-described embodiment, there are 32 blocks in each OTN row, and each block has 32×32 bits. Therefore, the codewords of the just-described embodiment have natural code length of Nc=1024 in the context of SDI. However, in order to fit the OTN row format in the standard, the code length is shortened in this embodiment to 1020. The redundancy of the BCH is 32 bits. As a result, this embodiment uses (1020,988) expurgated BCH code. The parameters of interest are:

(a) Number of codewords terminating in each OTN row: 64;
(b) Length of each codewords: 1020;
(c) Number of OTN rows spanned by the diagonal part of a codeword: 16; and
(d) Burst correction capability: ~3000 bits.

In this specific embodiment, the shortening of codewords from length 1024 to 1020 is done by eliminating the outermost two rows on each side.

Each location, in an array of storage locations and/or configuration locations (similar to FIG. 4A), can be specified by the ordered-triple (r, x, y) where r is the OTN row number, and (x,y) is the rectangular co-ordinate within the OTN row, with x denoting the horizontal distance from the left end of the OTN row array, and y denoting the vertical distance from the bottom of the OTN row array.

For codewords terminating in OTN row n, the location of bit j in codeword i with (i=0, 1, . . . , 63, j=0, 1, . . . , 1019) is given in the following table.

| Codeword i (i = 0, 1, . . . , 31) | | Codeword i (i = 32, 33, . . . , 63) | |
|---|---|---|---|
| Bit j<br>j = 0, 1, . . . ,<br>509<br>Diagonal Part | Bit j<br>j = 510,<br>511, . . . , 1019<br>Horizontal Part | Bit j<br>j = 0, 1, . . . ,<br>509<br>Diagonal Part | Bit j<br>j = 510,<br>511, . . . , 1019<br>Horizontal Part |
| // Take care of<br>shortening first<br>If j < 31, J = j + 1<br>Else J = j + 2<br>a = floor (J/32)<br>b = J mod 32<br>r = n − 16 + a<br>x = 16 b + a − 2<br>y = (J − i) mod 32 | r = n<br>x = 1019 + 510 −<br>j<br>y = 31− i | // Take care of<br>shortening first<br>If j < 31, J = j + 1<br>Else J = j + 2<br>a = floor (J/32)<br>b = J mod 32<br>r = n − 16 + a<br>x = 1021 − 16 b −<br>a<br>y = (J − i) mod 32 | r = n<br>x = j − 510<br>y = 63 − i |

An alternative embodiment is now described below, as it may be easier to implement than certain other embodiments. This alternate embodiment also allows an increase in the number of groups of bits from two (left and right) groups to a higher number of groups. For example, the number of groups can be extended to 4, which is named 4-way SDI. Some implementations in accordance with the invention use two groups of bits, and such embodiments are also called 2-way SDI. The alternate embodiment uses a flip of the right half of the codeword configuration shown in FIG. 4A using a lateral reflection, to obtain a codeword configuration shown in FIG. 5A. Moreover, the transmission order for the alternative embodiment is also modified accordingly, resulting in the order shown in FIG. 5B.

Figure 5A:
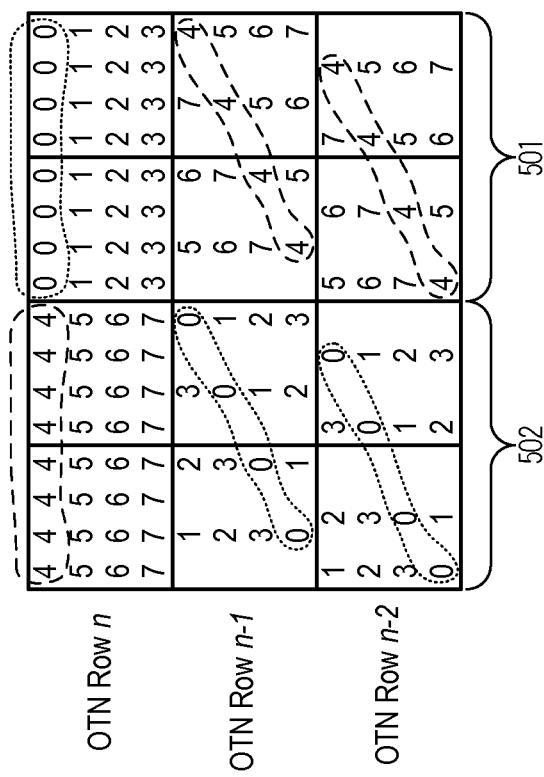
FIG. 5A illustrates the toy example of FIG. 4A in an alternative configuration that is implemented in some embodiments in accordance with the invention.
Figure 5B:
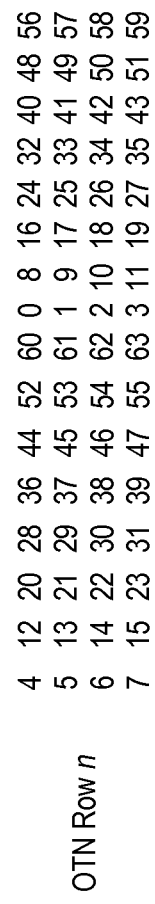
FIG. 5B illustrates a transmission order used to transmit a sequence from the two-dimensional array of FIG. 5A.

In the alternative embodiment illustrated in FIGS. 5A and 5B, all bits of all OTN rows are grouped into two groups, called right group 501 and left group 502. Each group consists of horizontal parts of codewords of a current OTN row, e.g. right codeword 0 and left codeword 4 are both illustrated in FIG. 5A as terminating in right group 501 and left group 502 respectively. Each location in right array 501 or left array 502 is identified by an ordered-triple (r, x, y) where r is the OTN row number, and (x,y) is the rectangular co-ordinate within the OTN row, with x denoting the horizontal distance from the left end of the left group, and y denoting the vertical distance from the bottom of the left group. For codewords terminating in OTN row n, the location of bit j in codeword i (i=0, 1, ..., 31, j=0, 1, ..., 1019) for the left and right codewords is given in the following table. Note that in the table, former codeword i (i=32, 33, ..., 63) described in reference to the above table has now been renamed left codeword i (i=0, 1, ..., 31) in the following table. Similarly, former codeword i (i=0, 1, ..., 31) now becomes right codeword i (i=0, 1, ..., 31).

| Left Codeword i (i = 0, 1, ..., 31) | | Right Codeword i (i = 0, 1, ..., 31) | |
|---|---|---|---|
| Bit j<br>j = 0, 1, ...,<br>509<br>Diagonal Part | Bit j<br>j = 510, 511, ...,<br>1019<br>Horizontal Part | Bit j<br>j = 0, 1, ...,<br>509<br>Diagonal Part | Bit j<br>j = 510,<br>511, ..., 1019<br>Horizontal Part |
| // Take care of<br>shortening first<br>If j < 31, J = j + 1<br>Else J = j + 2<br>a = floor (J/32)<br>b = J mod 32<br>Right Memory:<br>r = n − 16 + a<br>x = 16 b + a − 2<br>y = (J − i) mod 32 | Left Memory:<br>r = n<br>x = j − 510<br>y = 31 − i | // Take care of<br>shortening first<br>If j < 31, J = j + 1<br>Else J = j + 2<br>a = floor (J/32)<br>b = J mod 32<br>Left Memory:<br>r = n − 16 + a<br>x = 16 b + a − 2<br>y = (J − i) mod 32 | Right Memory:<br>r = n<br>x = j − 510<br>y = 31 − i |

Figure 5C:
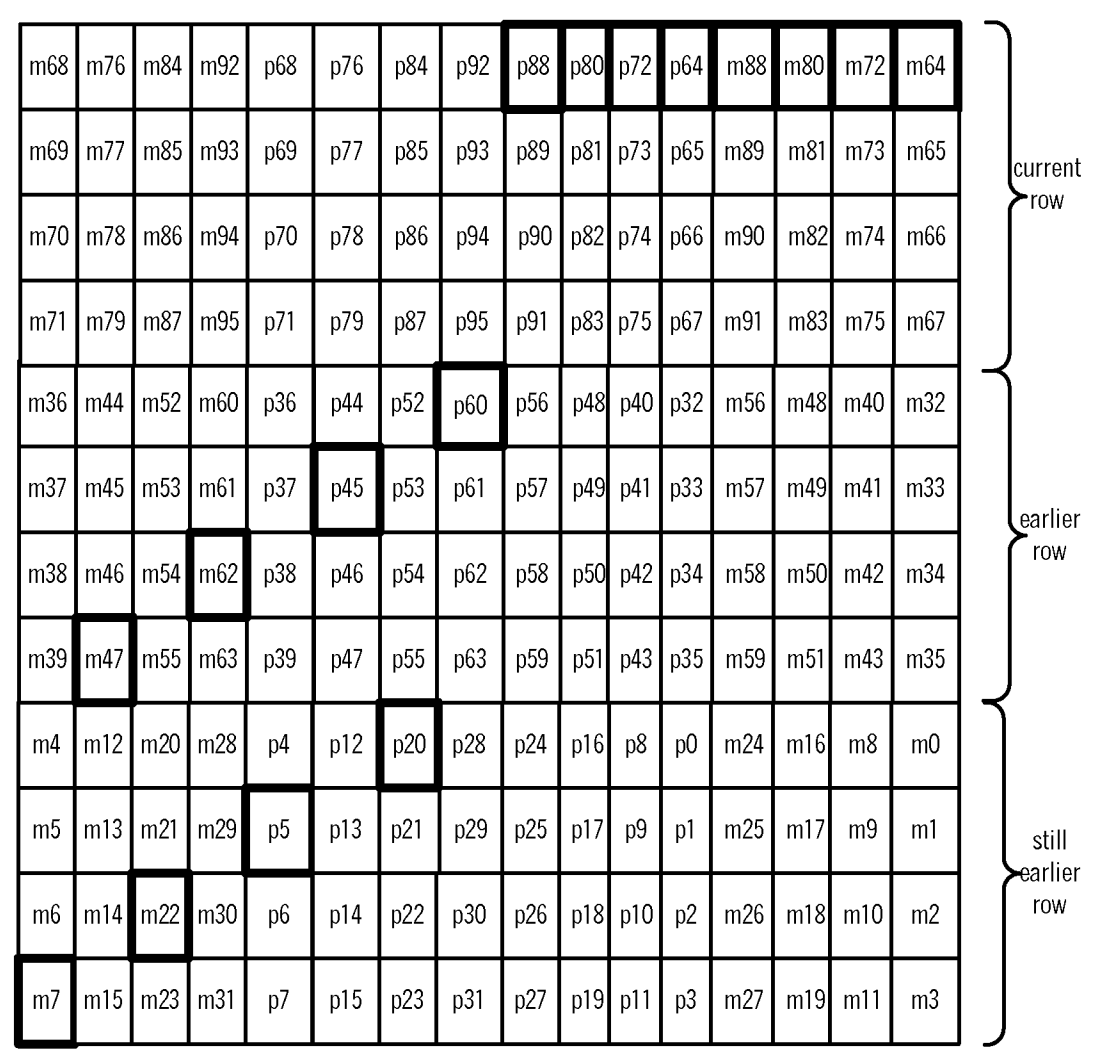

Parity computation for the toy example shown in FIG. 4A is now described in reference to FIG. 5C. The method is basically the same on the encoder and the decoder side with minor differences in the end. Typically, bits m0-m3 are received before any of the remaining bits shown in FIG. 5C. On receipt of bits m0-m3 the following parity bits are updated: p0-3, p8-11, p16-19, p24-27, and p68-71, p76-79, p84-87, p92-95. Next, bits m4-m7 are received, and the following parity bits are updated: p4-7, p12-15, p20-23, p28-31, and p64-67, p72-75, p80-83, p88-91. Thereafter, bits m8-m11 are received and the following parity bits are updated: p0-3, p8-11, p16-19, p24-27 and p36-39, p44-47, p52-55, p60-63. Then, bits m12-m15 are received and the following parity bits are updated: p4-7, p12-15, p20-23, p28-31 and p32-35, p40-43, p48-51, p56-59. When bits m0-m3 are the first bits to be transmitted by the encoder or received by the decoder, the computed values of p0-p31 are initialized e.g. to 0. If there were earlier rows received by the decoder or transmitted by the encoder, the computation of parity bits p0-p31 started before bits m0-m3 arrived and p0-p31 have previously computed partial values when m0-m3 arrive.

Next, bits m16-m19 are received, and these bits are used to update the previously computed values (as noted above) for the following parity bits: p0-3, p8-11, p16-19, p24-27, and p68-71, p76-79, p84-87, p92-95. Similarly, next bits m20-m23 are received, and these bits are used to update the previously computed values (as noted above) for the following parity bits: p64-67, p72-75, p80-83, p88-91. Also, bits m24-m27 are next received, and these bits are used to update the previously computed values (as noted above) for the following parity bits: p36-39, p44-47, p52-55, p60-63. Then bits m28-m31 are received, and these bits are used to update the previously computed values (as noted above) for the following parity bits: p32-35, p40-43, p48-51, p56-59. In the decoder, the above-described values are checked against the parity bits that are actually received next, e.g. bits p0-p3 are now received and checked against the earlier-computed values for p0-p3, and so on. In the encoder, the parity bits in the bottom row in FIG. 5C p0-p31 are computed in this way and ready to be transmitted. Meanwhile, encoder finishes transmitting bits m0-m31 that were used for computation of parity bits p0-p31 and some other parity bits in later rows. When the bits in the next row that need to be encoded/decoded (bits m32-m35) arrive, the procedure described above is repeated.

An encoder 231 (FIG. 2A) that prepares the codewords illustrated in FIG. 5A is implemented as follows in some embodiments of the invention. The actual numbers given below are illustrative for OTN, but can be easily generalized for any other communication systems. A particular circuit illustrated in FIG. 6A and described below assumes that codewords belong to a linear cyclic code, and that a remainder computation circuit can be used to compute parity bits. Circuit 632 of FIG. 6A computes parity bits and prepares OTN rows to be transmitted, as described in the preceding two paragraphs above for the case when codewords belong to the linear cyclic code. For this reason, circuit 632 is also referred to herein as "remainder computation circuit." For OTN, at any point in time, 1088=64×17 codewords are in the process of being encoded. The remainder state information (32 bits per codeword) is stored for each of the 1088 codewords, e.g. in registers as described below in reference to FIG. 6A.

Figure 6A:
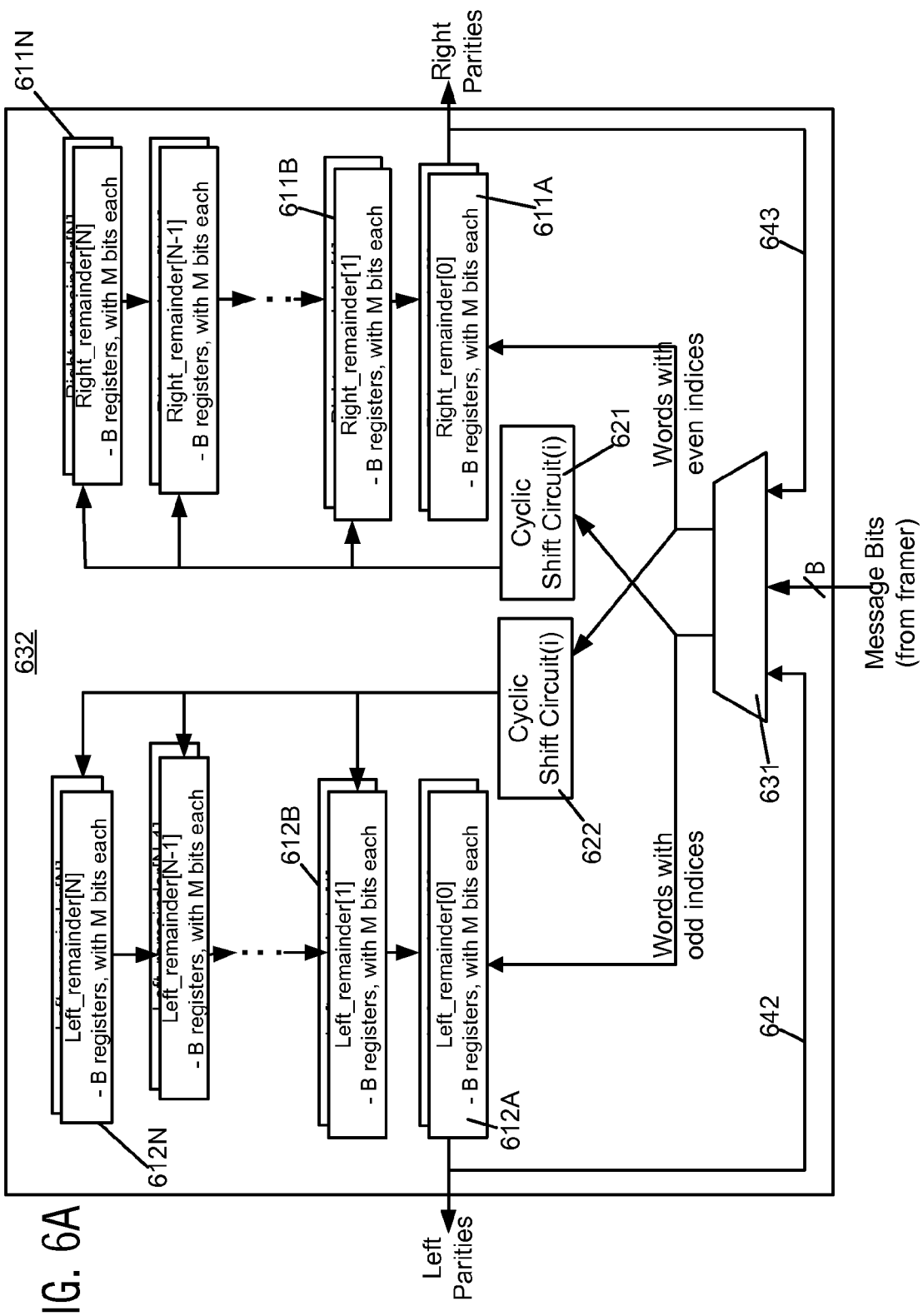
FIG. 6A illustrates, in a high level block diagram, registers and cyclic shift circuits that are used in a remainder computation circuit 632, in some aspects of the invention.
Figure 7:
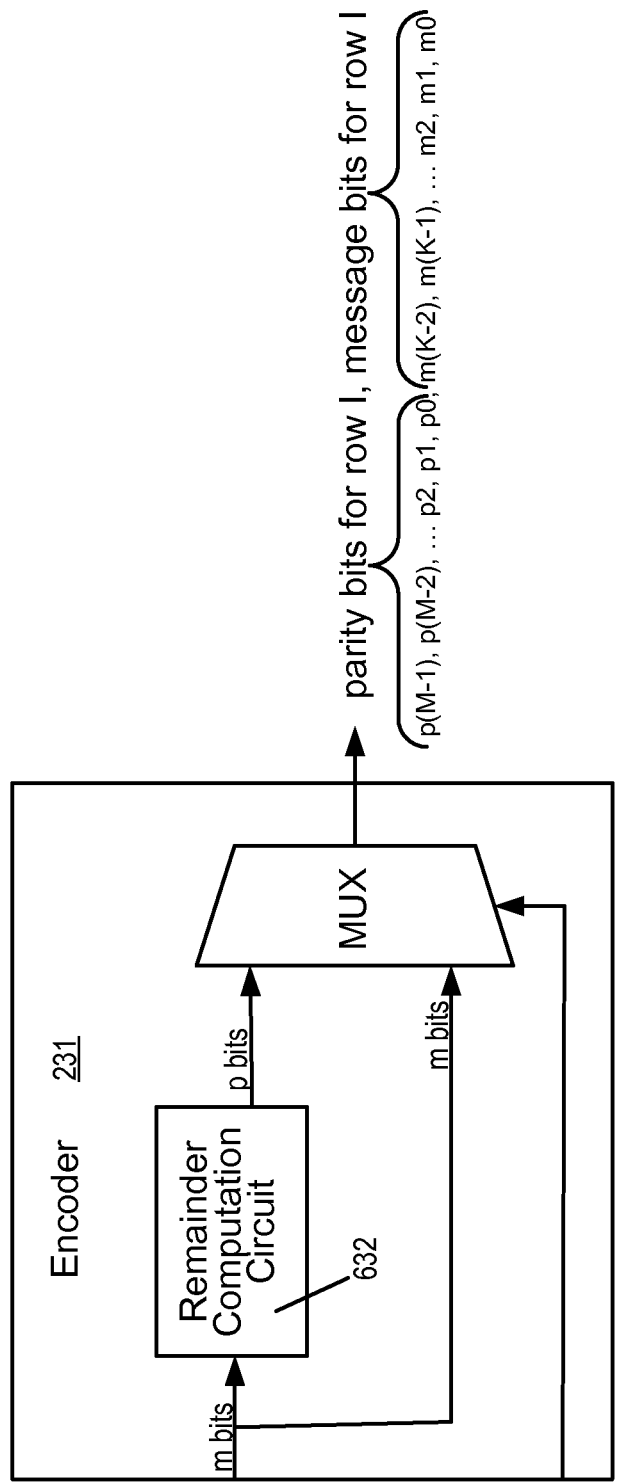
FIG. 7 illustrates, in an intermediate-level block diagram, use of the remainder computation circuit 632 in an encoder 231 in certain embodiments of the invention.
Figure 8A:
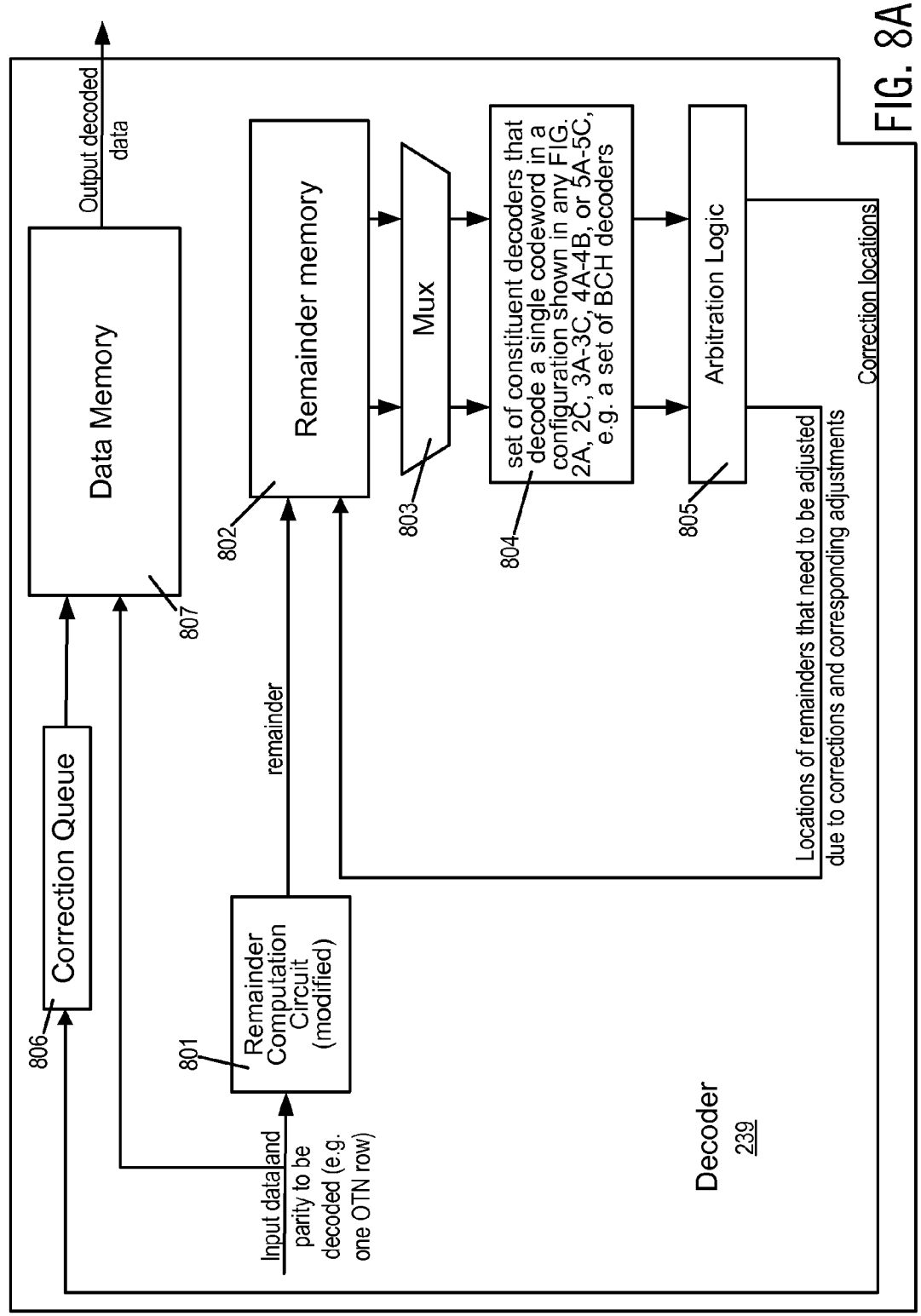
FIG. 8A illustrates, in another intermediate-level block diagram, use of a modified remainder computation circuit 632M (formed by modifying circuit 632 of FIG. 6A, by omission of feedback lines 642 and 643) in a decoder 239 in some embodiments of the invention.

Note that remainder computation circuit 632 is used in an encoder 231 as shown in FIG. 7. Another circuit 801 which is similar to (but modified from) remainder computation circuit 632 of FIG. 6A is used as part of decoder 239 as shown in FIG. 8A. The only difference is that the feedback connections 642 and 643 from the parity outputs of registers Left_remainder [0] and Right_remainder[0] shown in FIG. 6A for circuit 632 are not used in corresponding circuit 801 in FIG. 8A.

FIG. 6A illustrates, in a block diagram, certain items that are used to implement encoder 231. Specifically, encoder 231 includes a group of N+1 (e.g. seventeen) banks 611A-611N of registers ("right remainder registers"), for codewords terminating in the right array 501 (FIG. 5A). Moreover, encoder 231 (FIG. 6A) includes an additional group of N+1 (e.g. seventeen) banks 611A-611N of registers ("left remainder registers") for codewords terminating in the right array 501 (FIG. 5A). Each bank contains B copies of registers corresponding to B left and B right codewords, and each register size M depends on the particular code used, i.e. the number of parity bits in a codeword. In an illustrative real-life example in accordance with the invention and suitable for OTN applications, x=1, M=32 that corresponds to 32 parity bits of the (1020, 988) BCH code, with B=32 corresponding to 32 left and 32 right codewords, and N=16 corresponding to a span of one codeword across N+1 (or 17) OTN rows.

In FIG. 6A, bank 611N contains B registers for current OTN row n. Specifically, in FIG. 6A, the subscript identifies a specific bank of storage elements (e.g. registers) for a corresponding OTN row, in one of the two halves (i.e. either left half or right half) of encoder 632. In one specific example, a bank[i] contains the remainder registers (left or right depending on the bank) for OTN row n+i, where i ranges from 0 to 16. Encoder 231 also includes a cyclic shift circuit for each group of banks shown in FIG. 6A. For example, cyclic shift circuit 621 is used to perform a right (or downwards, using most significant bit (msb) first convention with transmission order of top to bottom within a word) cyclic shift of each incoming 32-bit word, by a variable amount from 0 to 31. In some embodiments, cyclic shift circuits 621 and 622 are identical to one another. Cyclic shift circuits 621 and 622 are implemented in certain illustrative embodiments by two identical shift registers, for example, two sets of flip-flops connected to one another in a predetermined manner.

Figure 6B:
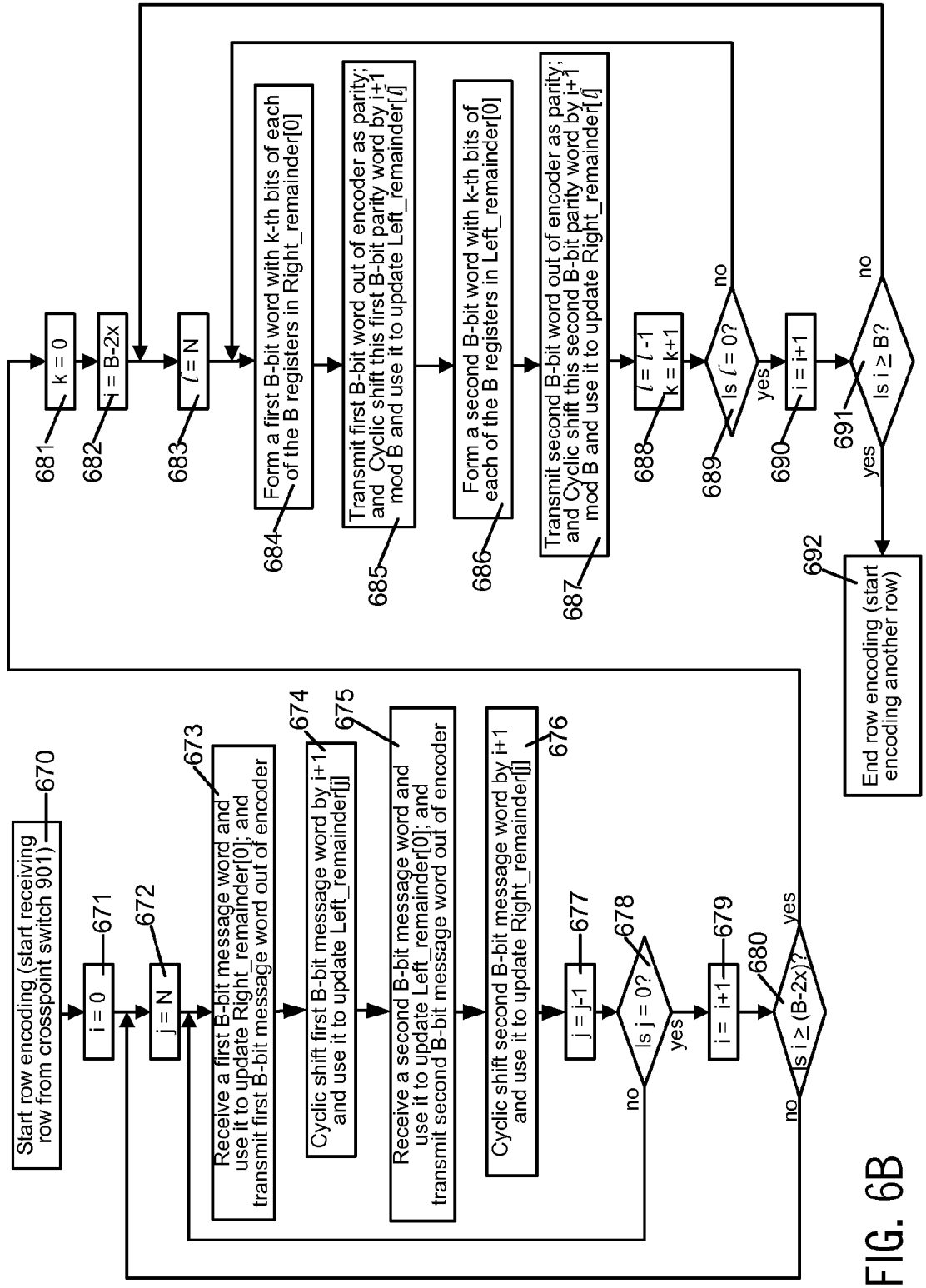
FIG. 6B illustrates, in a flow chart, acts performed by the remainder computation circuit 632 of FIG. 6A, in several aspects of the invention.

Some embodiments of encoder 632 perform a method of the type shown in FIG. 6B. Initially, encoder 632 is triggered by beginning of a row of data in act 670, and then goes to act 671 to set a loop index "i" to zero and then in act 672 sets another loop index "j" to N. Then, encoder 632 receives words in a sequence, and uses a current word of bits therein, to update in act 673, multiple storage elements in a set (called "initial first set") of storage elements 611A (e.g. B registers, namely registers Right_remainder [0]). The initial first set of storage elements 611A is one of several such sets included in a first group of storage elements (e.g. the right group of registers 611A-611N). The update in act 673 is typically, but not necessarily, based on one or more constituent code(s) of a systematic code of the type described above.

Furthermore, encoder 632 shifts all bits in the current word cyclically (as per act 674), by i+1 number of bits (with i=0 initially), to obtain a cyclically-shifted current word. Next, encoder 632 uses the cyclically-shifted current word to update (as per act 674) several storage elements in another set (called "next last set") of storage elements 612N (e.g. B registers, namely registers Left_remainder [j], j=N). The next last set of storage elements 612N is also one of several such sets included in a second group of storage elements (e.g. the left group of registers 612A-612N). This update in act 674 is also based on the same systematic code, as used in the update of act 673.

Next, encoder 632 receives and uses a next word of bits in the same sequence, to update in act 675, the storage elements in another set ("next first set") of storage elements 612A (e.g. B registers, namely registers Left_remainder [0]). The next first set of storage elements 612A is one of several such sets included in the second group of storage elements (e.g. the left group of registers 612A-612N). This update is also based on the same code, as used in act 673.

Furthermore, encoder 632 shifts all bits in the next word cyclically (as per act 676), by i+1 number of bits (with i=0 initially), to obtain a cyclically-shifted next word. Then, encoder 632 uses the cyclically-shifted next word to update (as per act 676) storage elements in yet another set (called "initial last set") of storage elements 611N (e.g. one of the B registers, namely registers Right_remainder [j], j=N). The initial last set of storage elements 612N is also one of several such sets included in the first group of storage elements (e.g. the right group of registers 612A-612N). This update in act 676 is also based on the same systematic code, as used in the update of act 673.

Thereafter, in act 677 encoder 632 decrements loop index j and returns to act 673 (described above) unless loop index j is zero (checked in act 678) and if so then goes to act 679. In act 679, encoder 632 increments loop index i and goes to act 680 to check if loop index i is greater than B−2x and if not returns to act 672 (described above) this time with an incremented loop index i, and then act 672 is performed. If the limit checked is reached in act 680, then encoder 632 takes the 'yes' branch to enter act 681.

In act 681, encoder 632 sets an index "k" to zero and then in act 682 sets another loop index "i" to B−2x. Then, encoder 632 goes to act 683 and sets yet another loop index ℓ to N and then goes to act 684. Next, in act 684, encoder 632 forms a new word with the k-th bits in each of the several storage elements, in the initial first set of storage elements 611A. Next, in act 685, encoder 632 transmits the new word out of encoder 632. Also in act 685, encoder 632 cyclically shifts the new word by i+1 mod B, and uses it to update still another set (called "initial update set") of storage elements 612N (e.g. one of the B registers, namely one of the registers Left_remainder [ℓ]).

Next, in act 686, encoder 632 forms an additional parity word with k-th bits in each of the several storage elements, in the next first set of storage elements 611A. Next, in act 687, encoder 632 transmits the additional parity word out of encoder 632. Also in act 687, encoder 632 cyclically shifts the additional parity word by i+1 mod B, and uses it to update still another set (called "next update set") of storage elements 611N (e.g. one of the B registers, namely one of the registers Right_remainder [ℓ]).

Next, in act 688, encoder 632 updates counter ℓ (by decrementing by 1) and counter k (incrementing by 1) and then goes to act 689. In act 689, encoder 632 checks if ℓ is zero, and if not zero returns to act 684 (described above). If ℓ is zero then next act 690 increments I and goes to act 691. In act 691, encoder 632 checks if i≥B is true, and if not returns to act 683 (described above). In act 691 if the answer is no, encoder 632 goes to act 692 and signals that row encoding has ended.

The method of FIG. 6B is described below in further detail, for certain illustrative embodiments. Specifically, a multiplexer 631 receives message bits (including payload and overhead bits) and supplies them to two groups of registers 611A-611N and 612A-612N. Registers in the two groups are accessed and used in an alternating order. For example, Left_remainder[0] and Right_remainder[0] registers 611A and 612A alternate relative to each other (see FIG. 6A) in receiving and storing the message bits. Therefore, bits of a current row received in act 670 (FIG. 6B) alternate between feeding even words (that form one group) to the right registers 611A-611N, and feeding odd words (that form another group) to the left registers 612A-612N. Moreover, when a block of message bits is used to update a Left_remainder[k] register (e.g. as per act 673), it is also passed through cyclic shift circuit 621 and used to update one of the Right_remainder[j] registers, with j=1, . . . , N, to partially compute parity in some embodiments (e.g. as per act 674). Such a partial computation eliminates the need to save message bits for future parity computation, because their contribution is computed and stored in remainder registers.

For example, a first block of message bits (e.g. bits m0-m3 in the toy example) is used to update Left_remainder[0] register 612A, it is also supplied at the input of cyclic shift circuit 621 and a cyclically-shifted output is used to update Right_remainder[N] register 611N. Next, a second block of message bits (e.g. bits m4-m8 in the toy example) is received and used to update Right_remainder[0] registers 611A (e.g. as per act 675), and also supplied at the input of cyclic shift circuit 622 and the result is used to update Left_remainder[N] register 612N (e.g. as per act 676).

Next, a third block of message bits (e.g. bits m9-m12 in the toy example) is used to update Left_remainder[0] register 612A and it is cyclically shifted, and this result is then used to update Left_remainder [N−1]. More generally, j determines which set of remainder registers is updated. And, the number of cyclic shifts that are performed is i. Both j and i depend on which of B bits in the payload are received at the input of multiplexer 631, in the overall input payload sequence. For simplicity of explanation of some illustrative examples, the total input payload sequence is assumed to have B*B*(B−2x) bits, and the number of parity bits M=x*B with x being an integer (e.g. x can have the value 1).

Depending on the embodiment, the number of parity bits and code length are not always multiples of basic block size B, but for skilled artisan in the area this can be easily achieved by methods of shortening or extending the underlying code. In OTN applications, certain embodiments set x=1. In such embodiments, the first and second sequence of B bits use i=1 cyclic shift, and then j=N set of remainder registers are updated. The next two sequences of B bits also use i=1 cyclic shift but update j=N−1 set of remainder registers (as a deviation, e.g. for OTN). The encoding proceeds with i=1 until j=1 set of remainder registers is updated. At this point, 2NB (i.e.

the product 2*N*B) input bits have been processed. For the next 2NB sequences, i=2 cyclic shifts are used and j varies as for the first set of 2NB bits from N to 1. This procedure is repeated with the number of cyclic shifts increasing until i=B−2x and the total input sequence of bits has been processed. At this point, the parity bits for the current row are given in the B registers of the Left_remainder[0] and B registers of the Right_remainder[0].

Note that in a general description of the SDI parameters given above, the codeword span is N=B/2, hence, 2NB=B$^2$, i.e. code length is B$^2$. While the parity bits are being transmitted, future remainders also need to be updated using the calculated parity. This is done in some embodiments, using the feedback from the output of Left_remainder[0] and Right__remainder[0] to the multiplexer 631. The computed current 2xB$^2$ parity bits are passed through the multiplexer 631 in sequences of B bits. The first B sequences of B bits are cyclically shifted by i=B−2x+1 with j decreasing from N down to 1. The second B sequences of B bits are cyclically shifted by i=B−2x+2 with j decreasing from N down to 1. This is repeated until the last B sequences of B bits are processed with i=B and j also decreasing from N down to 1.

Note that when the 2xB$^2$ parity bits are processed, only the registers containing future remainders are updated while Left_remainder[0] and Right_remainder[0] are no longer updated. Once parity bits are processed, Left_remainder[i] is shifted down to Left_remainder[i−1] for i=1 . . . N and Left_remainder[N] is set to zero. Similarly, Right_remainder[i] is shifted down to Right_remainder[i−1] for i=1 . . . N and Right_remainder[N] is set to zero. Note that although register shifting in a left group and a right group has been just described (after parity bits are processed), alternative embodiments simply rename the registers in each group, for a faster implementation. The actual implementation of a procedure of the type described above can vary depending on the embodiment.

One illustrative implementation of a remainder circuit that implements the above-described procedure is shown in FIG. 6A. A high level encoder that incorporates circuit 632 of FIG. 6A is illustratively shown in FIG. 7. A high level decoder that also incorporates circuit 632 of FIG. 6A with minor changes, is illustratively shown as circuit 801 in FIG. 8A. The encoder 231 of FIG. 7 and a decoder 239 of FIG. 8A are typically used in a transceiver 200 of the type illustrated in FIG. 9. For more detail on such transceivers, see the document entitled "100G Ultra Long Haul DWDM Framework Document" available at http://www.oiforum.com/public/documents/OIF-FD-100G-DWDM-01.0.pdf which is incorporated by reference herein in its entirety.

Subsections A, B and C are integral parts of this detailed description, and each subsection is incorporated by reference herein in its entirety. Subsection A describes the operations similar to those discussed above in reference to FIG. 6A that are performed with the arrival of each of the 956 32-bit words in an OTN row. When a 32-bit word is used to update a bank of 32 32-bit registers, 32 parallel single-bit encoding operations are performed. After processing all 956 32-bit words of payload in an OTN row, the contents of the banks of remainder registers are shifted down by one bank, and bank 16 is loaded with all zeros.

The following is a description of a decoding process that is used in certain illustrative embodiments of the invention. Specifically, a decoder 239 (FIG. 8A) of some embodiments fits all the required decoding tasks within an allocated time set by a predetermined transmission speed (e.g. 40 Gpbs), and organizes the memory 807 for efficient bandwidth utilization during the correction process, as follows. Instead of computing the power sum syndromes, in some embodiments described below decoder 239 is designed to compute the remainder. Such implementations allow the re-use of one or more components of encoder 231 (FIG. 6A), without significant changes as decoder 239. For example, in some implementations, encoder 231 (FIG. 6A) is used with a minor change as follows: feedback connects 642 and 643 from the parities back to the input of multiplexer 631 are eliminated in decoder 239.

For a particular application of this invention to OTN, no additional synchronization is needed other than establishment of OTN row boundary, normally provided by a framer. For example, in some embodiments, in the beginning of each frame, there is a frame alignment area which is a part of the overhead shown in FIG. 1A. This frame alignment area contains certain sequences/patterns of bits that are used by an OTN framer, to detect the beginning of the frame. Such an OTN framer 911 is coupled to FEC module 912 as shown in FIG. 9, in some embodiments of the invention.

Moreover, one or more aspects of the invention as described herein is/are applicable to other communication systems that do not have frame structure like a frame in OTN. In some embodiments, no additional synchronization is needed to establish an OTN row boundary while alternative embodiments use complicated FEC schemes that span multiple rows and require additional effort to establish the beginning of codewords relative to the frame and row boundaries. Such alternative embodiments are not directly applicable to OTN, but even so the alternative embodiments may be used in accordance with the invention if the necessary extra effort is made to establish codeword boundaries relative to frame boundaries.

When a new OTN row arrives, circuit 801 in decoder 239 (FIG. 2C) completes the remainder computation of the sixty-four codewords terminating in the new OTN row. Computing remainders is equivalent to computing syndromes. After circuit 801 completes the remainder computation, sixty-four 32-bit remainder state registers Left_remainder[0] and Right__remainder[0] are released to a next part of the decoder 239 (e.g. via remainder memory 802 and multiplexer 803 to set of constituent decoders 804). All other Left_remainder and Right_remainder registers are shifted down while registers Left_remainder[N] and Right_remainder[N] are initialized with zeros. At this point, registers Left_remainder[0] and Right_remainder[0] are used for storing the remainder state information for the sixty-four new codewords, which terminate in a new OTN row. Simultaneously, multiplexer 803 passes non-zero remainders (denoting errors in message bits) from memory 802 to constituent decoders 804.

In response to a non-zero remainder, constituent decoders 804 make a change in data memory 807 (via correction queue 806) to correct message bits, based on the locations of the non-zero remainders. Also, in response to the non-zero remainder, multiple constituent decoders 804 may change one or more other remainders in memory 802, based on a predetermined coding technique in use (such as BCH). Each of decoders 804 produces at its output, up to T errors that need to be corrected. Each error identifies a location loc(J) (J=0, 1, . . . T−1) in a current codeword at which a bit of the data is incorrect. This same bit of data (which is erroneous) is also included in an additional codeword (intersecting codeword) that is associated with the current codeword, due to sharing of this bit of data in an SDI configuration of codewords. Each such intersecting codeword has a remainder R(J) in the remainder memory 802 (FIG. 8A). Depending on the R(J) position in the pipeline or outside the pipeline and its value after the adjustment, different actions may need to be taken (as described below in reference to acts 856, 861 and 862 in FIG. 8B).

As noted above, in some embodiments, operation of constituent decoders 804 is pipelined. A constituent decoder's pipeline may be stalled when an error decoded in the currently processed row is found to affect a remainder of a row to be processed in the future. After constituent decoders 804 complete their update to correct the errors and adjust intersecting remainders, the pipeline is flushed and re-started.

Figure 8B:
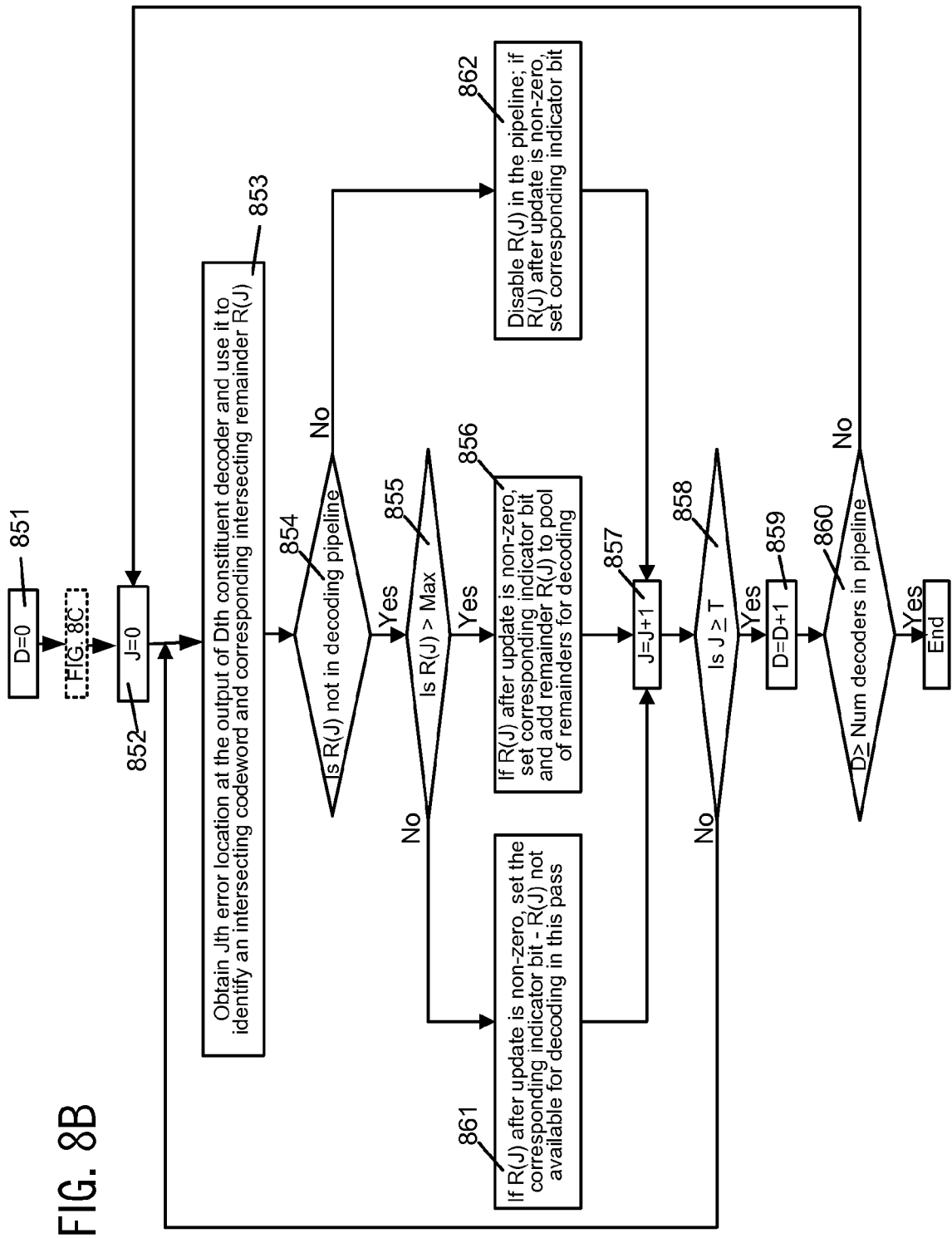
FIG. 8B illustrates, in a flow chart, acts performed by the arbitration logic 805 of FIG. 8A, in several aspects of the invention.

In several embodiments, an arbitration logic 805 receives errors identified by constituent decoders 804 and performs the acts illustrated in FIG. 8B. Specifically, in acts 851 and 852 D and J are respectively initialized to the value 0, followed by act 853. In act 853, arbitration logic 805 obtains an error location, now processed as the Jth error, from one of constituent decoders 804 that is now identified as the Dth constituent decoder. Next, arbitration logic 805 uses the just-identified Jth error to identify an intersecting codeword (in a different group from the group containing the codeword having the Jth error) and a corresponding remainder R(J), which is also referred to as an intersecting remainder.

Then arbitration logic 805 checks in act 854, a state of intersecting remainder R(J), e.g. whether R(J) is currently not present in any of multiple constituent decoders 804 (e.g. wherein constituent decoders 804 are used to check codewords for errors). If the answer in act 854 is no (e.g. because R(J) is present in a decoding pipeline of one of decoders 804), then arbitration logic 805 goes to act 862 and disables decoding of R(J) by that constituent decoder 804 (in whose decoding pipeline R(J) is present), and thereafter goes to act 857 (described below). In act 854 if the answer is yes, then arbitration logic 805 goes to act 855 and checks if R(J)>Max, wherein Max denotes the largest index of any codeword currently being decoded (e.g. the highest index of all codewords in constituent decoders 804).

If the answer in act 855 is yes and R(J) is non-zero after the update, then R(J) is to be decoded in future, and therefore arbitration logic 805 performs act 856 by setting an indicator bit and adds remainder R(J) to a pool of remainders that are awaiting decoding. If the answer in act 855 is no, then as per act 861 arbitration logic 805 updates R(J) and when the result of update is non-zero (i.e. error) sets a corresponding indicator bit, thereby to mark the updated R(J) as being not available for decoding in a current pass (i.e. current iteration of decoding), and instead the updated R(J) is to be decoded in future (e.g. in a next iteration of decoding). After performing any of acts 861 and 856 and 863, arbitration logic 805 goes to act 857 to increment J, and then checks in act 858 whether J≥T, wherein T is the number of errors in a current codeword.

In act 858, if the answer is no, arbitration logic 805 returns to act 853 (described above). However, if the answer is yes in act 858, arbitration logic 805 increments D in act 859 and then goes to act 860. In act 860, arbitration logic 805 checks whether D≥number of constituent decoders in the pipeline and if so this process ends. If the answer in act 860 is no, arbitration logic 805 returns to act 852.

Note that in some embodiments, arbitration logic 805 is implemented by multiple units in hardware that concurrently perform acts 852-858 (FIG. 8B) in parallel with one another but operating on different errors and in such embodiments, there is no need to perform acts 851, 859 and 860 (i.e. no need for a loop to sequentially process errors from multiple decoders, using counter D). Moreover, several of these steps can be done for all concurrent decoders and all error locations in parallel. Note that such acts are shown sequentially in FIG. 8B, so that it can be shown that these steps may be done for every decoder and every error location, but the actual implementation in hardware may be parallel.

In some embodiments, as shown by a dotted box between acts 851 and 852 in FIG. 8B, arbitration logic 805 performs an optional method of the type illustrated in FIG. 8C. Specifically, in an act 871, arbitration logic 805 uses locations of errors in a currently decoded codeword to determine remainders of additional codewords that intersect with this currently decoded codeword at these locations of these errors. Such remainders are also referred to as "intersecting remainders" and denoted by R(0), R(1), . . . R(T−1), wherein T is the number of errors to be corrected. Next, in act 872, arbitration logic 805 counts the number J0 of these intersecting remainders that are equal to zero. Then, in act 873, arbitration logic 805 checks if this number J0 is greater than Nz, wherein Nz is a parameter that is programmable, as described below. When the result in act 873 is no, then arbitration logic 805 goes to act 874 and performs error correction in the normal manner. When the result in act 873 is yes, then arbitration logic 805 skips corrections as per branch 875 in FIG. 8C, and ends in act 876.

In certain embodiments that conform to OTN, no extra effort is needed to establish row boundaries and instead, the FEC module 912 simply uses rows as they come in from OTN framer 911 (FIG. 9). Accordingly, when a new OTN row arrives, 64 new remainders are computed by decoder 239 (32 left remainders for codewords terminating on the left side, and 32 right remainders for codewords terminating on the right side). Decoder 239 then starts a group of decoding tasks based on these 64 new remainders, and Mr additional sets of 64 remainders each corresponding to the previous Mr OTN rows. In some embodiments, the number of previous rows Mr that is used in decoding is determined by simulation. Too large a value of Mr implies large decoding latency and increased complexity, but too small a value of Mr results in degradation of performance. For an illustrative OTN application, some embodiments use Mr=47.

Accordingly, a total of 48 sets of left and right remainders are labeled as: Left_remainder[n], Left_remainder[n−1], . . . , Left_remainder[n−47], and Right_remainder[n], Right_remainder[n−1], . . . , Right_remainder[n−47]. Each set of left/right remainders contain thirty-two 32-bit remainders, because B=32 and M=32 as noted above. Each group of decoding tasks is described as shown in Subsection B below, which is incorporated by reference herein in its entirety. Specifically, decoder 239 only decodes non-zero remainders that have not been changed since the last time those same remainder were decoded. For example, a remainder that had been decoded and found undecodable before, and has since not been changed, need not be decoded again at this time. The tracking of such remainders is done through indicator bits in some embodiments.

In decoder 239, the oldest set of remainders (i=n−47) cover received bits all the way back to OTN row n−63. As a result, a total of 64 OTN rows are stored, in a buffer of size about 2M bits. After all 48 OTN rows of remainders are decoded, decoder 239 outputs an OTN row. A typical strategy is for decoder 239 to output bits in OTN row n−63, which maximizes coding gain. However, simulation shows negligible degradation in coding gain performance even if decoder 239 outputs row n−48 instead. This reduces latency to 1.5 million bits instead of 2 million bits.

The degradation in performance when row n−48 is released can be estimated from simulations to be up to 0.05 dB compared to the scenario when row n−63 is released. We have observed degradation not greater than 1.5 order in magnitude in output bit error rate (BER) down to BER=$1E^{-13}$. Note that this latency value is only for some embodiments in accordance with OTN where row size is 32K bits. In other application, for other row sizes, the latency is different. The latency is calculated as follows as the latest OTN row enters the decoder—specifically, there are 64 OTN rows previously received stored in the memory; so when the next row comes in, the oldest row (the row that was received the earliest) is released; therefore, the time from the moment a row enters the decoder until that row is released is ~64 rows which is 32*64K=2 million bits.

To support 40 Gpbs transmission, decoder 239 must complete each group of decoding tasks in 127.5 clock cycles (assuming 180 MHz clock). In order to reduce the number of decodes required, decoder 239 keeps track of remainder indicators which indicate whether a remainder has been updated since it was last decoded. Simulations have been performed to profile the number of decodes needed within the 127.5 available cycles during an OTN row period.

Decoder 239 of some embodiments is designed to operate on a true row by row decoding schedule. Specifically, the decoding schedule within each group of decoding tasks described above presents the following challenges. After a row is decoded, the remainders for the previous row need to be updated by decoder 239, before the decoding for that row begins. Due to the relatively high pipeline latency of the decoding and remainder update process (estimated to be 5 cycles in some embodiments of decoder 239), the multiplication of this overhead by up to 48 times more than uses up the 127.5 available cycles (to support 40 Gbps transmission).

Unfortunately, simulations show that there is noticeable loss of performance if decoder 239 completes all the decoding of the right remainders before decoder 239 decodes the left remainders. As a result, this non-blocking decoding schedule (which pays the penalty of the 5 cycles of pipeline overhead only once) cannot be used by decoder 239. Hence, decoder 239 is designed to use a true row by row decoding schedule which does not compromise performance. Statistics collected with this schedule shows an average number of 168 decodes, with a standard deviation of 21 decodes, for the arrival of each OTN row. Therefore, decoder 239 of some embodiments is implemented by eight copies of decoding circuits that decode single codeword of the SDI configuration and that operate in parallel relative to one another, to provide the necessary processing power for decoding within the 127.5 available cycles (to support 40 Gpbs transmission).

One way to implement true row by row decoding in decoder 239 involves pipeline overhead penalty, which can be excessive for the following reason. Every time decoder 239 switches from decoding row i to row i−1, decoder 239 incurs 4 additional cycles of penalty. This can happen for a total of 47 times, for an aggregate of 168 overhead penalty cycles, which is excessive compared with the 127 available cycles. Hence, decoder 239 implements a true row by row decoding by dividing up the group of decoding tasks within the time period of one OTN row into a number of rounds as follows. A round of decoding in decoder 239 ends in one of three ways (A), (B) or (C) as follows:

(A) After completion of decoding of row i, and the discovery that at least one remainder corresponding to row i−1 has been affected by the decoding within the current round.

(B) After the completion of decoding of row n−47.

(C) After decoder 239 runs out of cycles in the time period of one OTN row.

Therefore, decoder 239 of this embodiment only incurs 4 cycles of pipeline overhead, once at the end of each round. Within a round, say consisting of the decoding of rows j, j−1, ..., j−k, all the remainders with non-zero indicators corresponding to these rows are grouped together and automatically divided evenly (in some embodiments, as evenly as possible) among the 8 decoders.

In order to implement the above-described scheme effectively, decoder 239 of some embodiments puts remainders with non-zero indicators into a decoding pipe. Upon detection of the end of a round as described in the above paragraph, decoder 239 aborts the processing of the decoder tasks in the pipeline that belong to future rounds, flushes out the entire pipeline, and re-starts the next round with the aborted tasks corresponding to the most recent row. This "abort and re-start" non-blocking scheme has been simulated and confirmed to work well for the 40 Gps implementation with 127 cycles per OTN row.

A memory organization for use with SDI and encoding/decoding is described below, for an illustrative implementation of decoder 239. Simulation statistics for some implementations show an average of 215 corrected bits per OTN row, which indicates that eight physical memories (operating with the basic clock speed) should be enough to provide the required correction bandwidth. In order to equalize the load of each of the eight memories for the case of burst correction, decoder 239 re-arranges incoming bits and distributes them to the eight physical memories in the following manner. As the stream of 32-bit words comes in from a channel, decoder 239 segments them into blocks of 32 words, forming a 32×32-bit matrix. Decoder 239 then takes the transpose of the matrix to obtain a transposed set of 32 words. The words in this transposed set are then distributed in a round-robin manner to each of the eight physical memories.

In some embodiments of decoder 239, only the message bits are stored in memory. As a result, there are 2×478 32-bit words in each OTN row. This is rounded up to 2×480 32-bit words for an integer number of 32×32-bit blocks. For each OTN row, there are 120 32-bit words for each physical memory used by decoder 239. In order to provide enough bandwidth for writing in a new OTN row and reading out a decoded OTN row, the 120 32-bit words are actually arranged in memory in a configuration of 15 deep and 256 bits wide. The 64 copies of each physical memory across the 64 OTN rows are concatenated to form a 960 deep by 256 wide array.

Figure 10:
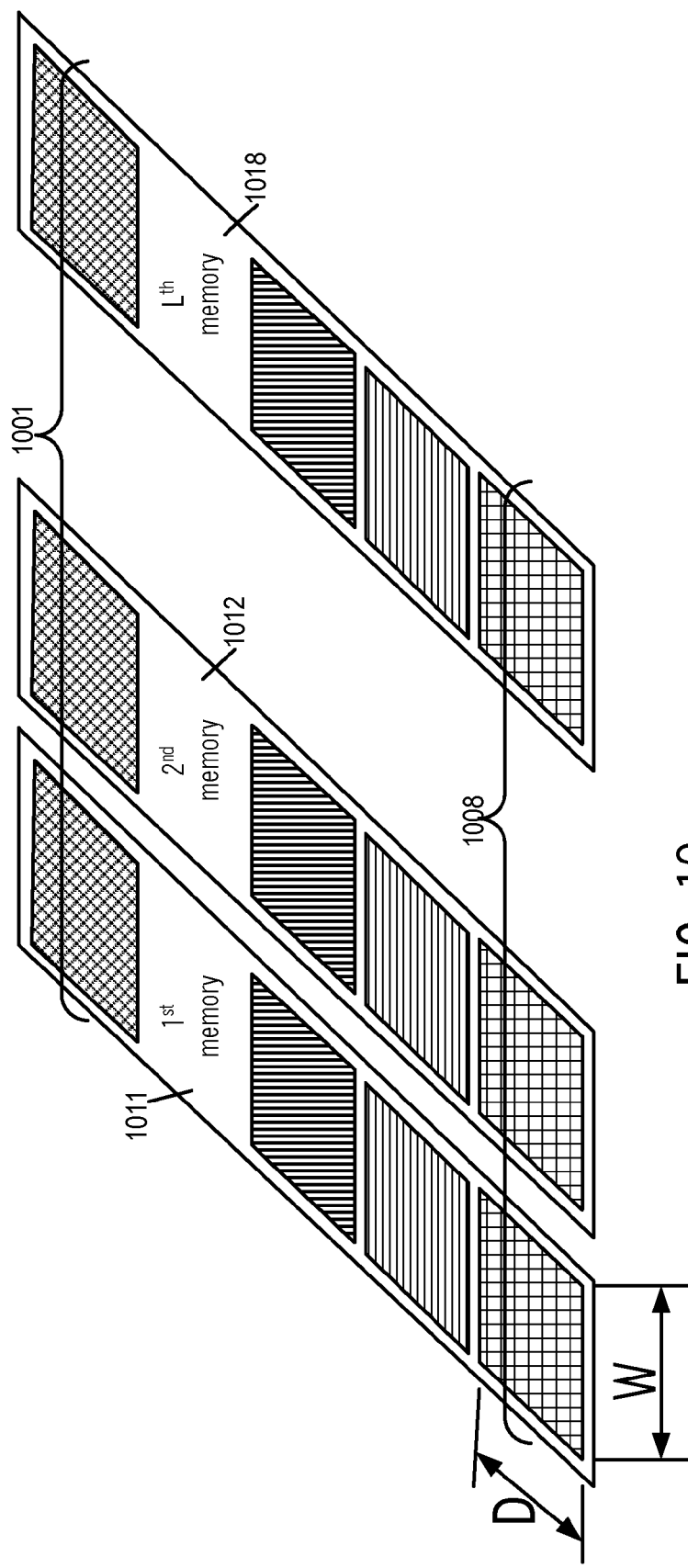
FIG. 10 illustrates, in a high level block diagram, use of several memories 1011-1018 to hold the data of each of rows 1001-1008 in some aspects of the invention.

Several embodiments of encoder 232 do not hold the entirety of array 210 in memory, and instead merely use the configuration illustrated in FIG. 2A to perform encoding as described above. Furthermore, several embodiments do not also hold such an array in memory for decoder 239, and instead the memory is organized as illustrated in FIG. 10 and described below.

In some embodiments, a wide data bus of 256 bits allows a total of 2048 bits to be written or read in a single memory clock cycle (which is the same as the basic clock cycle of decoder 239). Out of the 127.5 cycles per OTN row, 15 cycles are used for writing to a new OTN row in memory, and 15 cycles are used for reading out a decoded OTN row from memory. Doing so results in decoder 239 having 96 clock cycles available, for making corrections.

Decoder 239 of some embodiments also uses correction queues for each of the eight memories. Each entry in a correction queue of decoder 239 is 18 bits wide. With 215 corrections per OTN row spread over 8 memories coupled to decoder 239, the probability of one memory getting more than 96 corrections is upper bounded by $10^{-24}$. For this reason, decoder 239 uses one or more correction queues (see FIG. 8A) of depth 96.

Note that decoder 239 does not flush out its correction queues, every OTN row. Specifically, if corrections are not made in time within the 96 cycles allocated to any particular OTN row, then the correction information is kept unchanged in the correction queues, and the corrections are made later, by decoder 239. Keeping the correction information unchanged over time (i.e. across OTN rows), implements time averaging of the correction load on decoder 239 of some embodiments. Simulation at 9.45 dB coding gain shows a maximum correction queue depth of 23 for 10,000 OTN rows. For this reason, decoder 239 of some embodiments uses a depth of 96 entries for each correction queue, even when correcting burst errors.

Some illustrative embodiments are implemented for transmission at 100 Gbps in which decoder 239 has only 63.75 clock cycles per OTN row. Hence, decoder 239 does not use the true row by row decoding schedule described above. Instead, decoder 239 uses a modified decoding schedule described below whose coding gain degradation is minimal when compared with the above-described true row by row decoding.

Specifically, in the modified decoding schedule, decoder 239 still uses eight decoding circuits that are operated in parallel. In such an implementation, the 48 rows of remainders are labeled as row 0 to row 47, with row 0 being the current row, and row 47 being the oldest row. All remainders from 0 to 3071 are also labeled (total of 3072=64×48 codewords). Hence, in this implementation, remainders 0 to 63 belong to row 0, remainders 64 to 127 belong to row 1 and so on. Such a decoder 239 implements a method of the type described below in Subsection C which is an integral part of this detailed description and incorporated by reference herein in its entirety.

The modified schedule described in Subsection C below has the advantage of keeping the hardware complexity relatively low. Decoder 239 only needs to deal with the disabling of the entry within the pipeline when there is a hit as depicted in case (1). No special care is needed to handle case (2). It happens somewhat naturally in the pipeline implementation. Since the pipeline overhead is incurred only once per row, it fits easily into the available 63.75 cycles per OTN row.

The memory organization for embodiments that transmit at 100 Gbps is the same as the one described above for 40 Gbps except that 32 physical memories are used in this implementation. As the stream of 32-bit words is received from the channel, decoder 239 segments them into blocks of 32 words, forming a 32×32-bit matrix. Decoder 239 then takes a transpose of this 32×32-bit matrix to obtain a transposed set of 32 words. The words in this transposed set are then distributed by decoder 239, in a round-robin manner to each of the 32 physical memories.

Similar to the 40 Gbps architecture described above, in the 100 Gbps architecture as well there are 2×480 32-bit words for each OTN row. However, with 32 physical memories in the memory (for 100 Gbps speed decoder 239), there are now 30 32-bit words for each physical memory. In order to provide enough bandwidth for writing in a new OTN row and reading out a decoded OTN row, the 30 32-bit words are actually arranged in a configuration of 7.5 deep (rounded up to 8, depending on details of hardware implementation) and 128 bits wide. The 64 copies of each physical memory across the 64 OTN rows are concatenated to form a 480 deep (rounded up to 512 deep, depending on details of hardware implementation) by 128 wide memory.

In several embodiments, a data bus width of 128 bits allows a total of 4096 bits to be written or read in a single memory clock cycle (which is the same as the basic clock cycle). Out of the 63.75 cycles per OTN row, 8 cycles are used for writing in a new OTN row, and 8 cycles are used for reading out a decoded OTN row. Doing so results in decoder 239 having 47 clock cycles available, for making corrections. With 215 corrections per OTN row spread over 32 memories, the probability of one memory getting more than 47 corrections is upper bounded by $10^{-21}$. Simulation at 9.45 dB coding gain shows a maximum correction queue depth of 16 for 10,000 OTN rows. For this reason, decoder 239 of some embodiments that operate at 100 Gbps uses a depth of 48 entries for each correction queue, even when correcting burst errors. Note that each entry in the correction queue is 16 bits wide.

A particular memory organization of the type described herein for embodiments that transmit at 100 Gbps or 40 Gbps can be easily generalized by the skilled artisan. This general memory organization is illustrated in FIG. 10. The data bits are stored in L memories 1011, 1012 . . . 1018, each of width W. The depth of each memory 1011, 1012, . . . 1018 for one row is D, and if Nr is the total number of rows stored in a memory, the total depth of each memory is Nr*D. If each of rows 1001 . . . 1008 has B array rows in the SDI configuration, the B2 received bits of one row are stored in a B×B matrix, that is transposed and B words of B bits in this transposed matrix are stored in L memories in a round-robin fashion. Essentially, the B2 received bits are block interleaved before being stored into memories to avoid too big overload of a single memory in bursty channels. In FIG. 10, row 1001 is the oldest received row while row 1008 is the most recently received row. The numbers L and W are selected to satisfy the error correction requirements as well as clock and network speed.

The above descriptions of decoding provide details of specific decoder implementations for illustrative embodiments in conformance with OTN requirements to achieve 40 or 100 Gbps. However, a decoder architecture as shown in FIG. 8A as well as how to implement a decoder as described in a paragraph above (in reference to true row-by-row decoding) and in Subsection C below, are generally applicable to any communication system and therefore not limited to OTN as will be readily apparent to the skilled artisan in view of this detailed description.

Several embodiments in accordance with the invention perform enhanced decoding as follows. A single codeword in an SDI configuration can belong to any error correcting code, as mentioned earlier. For example, in application for OTN, (1020, 988) BCH code can be used. If the error correcting code is weak and has large miscorrection probability, e.g. for high input BER, the probability of miscorrection is high. By detecting and disabling miscorrection, some embodiments significantly improve the performance in terms of improving the output BER many orders of magnitude. The enhanced decoding that includes detection of miscorrection is implemented as follows. After each decoding of a single codeword, corrections to the data bits are made as well as corresponding adjustments to the remainders/syndromes of intersecting codewords (codewords that share corrected bits with decoded codeword) as shown in FIG. 8A. Let the number of intersecting codewords be J. And let the number of intersecting codewords with zero remainder/syndrome prior to adjustment be $J0 \le J$. If $J0 > Nz$, the corrections and adjustments are blocked. The number Nz is the parameter of the enhanced decoding and can be programmable and also dependent on the row number. For example, Nz=0 is used in certain embodiments using very aggressive schemes assuming that miscorrection is very likely, and higher numbers are used when the miscorrection is less likely. In another example, some embodiments use Nz=0 when decoding latest rows in the decoder, the ones that have more errors, and progressively increase Nz as older rows are decoded in the decoder. If T is the error correcting capability of the code used, setting Nz≥T practically turns off enhaced decoding.

One or more circuits and/or methods described herein may be implemented and/or performed in various ways. For example, one or more features and/or circuit elements and/or method steps/acts described above and/or illustrated in FIGS. 2A-2D, 3A-3C, 4A-4B, 5A-5B, 6A-6B, 7, 8A-8C, 9 and 10 may be implemented in hardware, firmware, software, or a combination thereof. For several implementations, one or more features and/or circuit elements and/or method steps/acts described above and/or illustrated in the just-described figures may be used and/or implemented within specific hardware, e.g. one or more application specific integrated circuits (ASICs), digital signal processors (DSPs), programmable logic devices (PLDs), field programmable gate arrays (FPGAs), processors, controllers, micro-controllers, microprocessors, electronic devices, circuits and systems designed to perform the functions described herein, or a combination thereof.

For certain implementations, one or more features and/or circuit elements and/or method steps/acts described above and/or illustrated in the just-described figures may be implemented with modules (e.g., procedures, functions, and so on) that perform the functions described herein by use of software and/or firmware executing in hardware of the type just described in the previous sentence. Additionally, any non-transitory machine readable medium tangibly embodying instructions to one or more processors may be used in implementing one or more features and/or circuit elements and/or method steps/acts described above and/or illustrated in the above-described figures. Also, as used herein the terms "memory" and "storage element" refer to any type of long term, short term, volatile (e.g. DRAM), nonvolatile (e.g. SRAM), flip-flop, latch, or other memory that is non-transitory and accessible by any circuitry, such as a processor.

Although in certain embodiments an optical interface 920 (including a laser, integrated photonics, QPSK mux and DSP to perform analog/digital conversion) is coupled between an optical mux/demux 202 and an FEC module 912 (including encoder 231 and decoder 239) as described above, network elements in accordance with the invention may use such an encoder and/or decoder with an electrical interface as media interface 208 to communicate with one another, in the manner described herein.

Accordingly, a circuit and method in some embodiments form a codeword including parity and message bits, as follows. Each codeword has a first part in a current sequence (e.g. a current OTN-row) that is to be now transmitted and second part spread across multiple past sequences (e.g. previously prepared and transmitted OTN-rows). The columns of an array, in which the codewords are stored, are grouped into multiple groups such that one part of each codeword is stored in one group of columns and another part of each codeword is in a different group of columns. Each codeword with a specific part (e.g. first part) in a group has no bit in common with another codeword that also has the same specific part (e.g. first part) in that group. Moreover, one part of each codeword stored in a group has a bit in common with another codeword's another part stored in the same group.

Although in some examples described above, each codeword has length of 16 bits, with 12 message bits and 4 parity check bits, as will be readily apparent to the skilled artisan in view of this disclosure, simpler configurations can be implemented to form a codeword having a different number of total bits and/or a different number of message and parity bits. For example, the above described configuration can be used with a codeword having a length of 32 bits, with 24 message bits and 8 parity bits. Moreover, although the detailed description above refers to configuration of a codeword at the level of bits, as will be readily apparent to the skilled artisan in view of this disclosure, similar configurations of a codeword can be implemented at the level of bytes, or words etc.

Although certain embodiments are illustrated and descried in hardware, other embodiments may use instructions to one or more processors 933 that are stored on a non-transitory computer-readable storage medium, such as memory 934 (which may be, for example, a random access memory). Such instructions in memory 934 may include, for example, instructions to one or more processors 933 to receive a current sequence of bits (e.g. from a digital signal processor (DSP) in optical interface 920). Moreover, instructions in memory 934 may further include, for example, instructions to the one or more processors 933 (and optionally instructions to DSP 922) to check for errors in a plurality of codewords that are grouped into multiple groups, e.g. in memory 934.

Therefore, one or more processors 933, when executing the just-described instructions, are configured to treat each codeword as having a first set of bits in a current sequence as well as a second set of said bits in several past sequences. The past sequences include bits that are received by execution of such instructions prior to receipt of the current sequence, wherein each codeword in a group has no bit in common with another codeword in said group and wherein each codeword in said group has a bit in common with another codeword in another group, and wherein the first set and the second set together comprise message bits and parity bits of said each codeword. Such instructions may include further instructions to the one or more processors 933 to store in memory 934, a result obtained at least partially based on execution of the instructions to check. Note that although a DSP 922 is shown in FIG. 9 as being included in optical interface 920, in certain embodiments DSP 922 is used instead of processor(s) 933 to perform some acts, e.g. to execute instructions described in the current paragraph and in the preceding paragraph.

Therefore, numerous modifications and adaptations of the embodiments and aspects described herein will become apparent to the skilled artisan in view of this disclosure. Numerous modifications and adaptations of the embodiments and aspects described herein are encompassed by the scope of the invention.

---

Subsection A (of Detailed Description)

```
for (i=0;i<30;i++) {
    if (i=0) j = 14; // due to shortening
    else j = 16;
    while (j>0) {
        // Even index
        receive a 32-bit payload word with even index
        use receive word to update Right_remainder[0]
        cyclic shift receive word by i+1 bits
        use cyclic shifted word to update Left_remainder[j].
        // Odd index
        receive a 32-bit payload word with odd index
        use receive word to update Left_remainder[0]
        cyclic shift receive word by i+1 bits
        use cyclic shifted word to update Right_remainder[j].
        j--;
    }
}
// Right_remainder[0] and Left_remainder[0] now contain parities
// handle parities
k = 0;
for (i=30;i<32;i++) {
    j = 16;
```

| Subsection A (of Detailed Description) |
| --- |
| while (j>0) {<br>    // Even index<br>    form a 32-bit word using bit k of each of the 32 32-bit registers in Right_remainder[0]<br>        cyclic shift the word by (i+1) mod 32 bits<br>        use cyclic shifted word to update Left_remainder[j]<br>    // Odd index<br>form a 32-bit word using bit k of each of the 32 32-bit registers in Left_remainder[0] cyclic shift the word by (i+1) mod 32 bits use cyclic shifted word to update Right_remainder[j]<br>        j--;<br>        k++;<br>    }<br>} |

Subsection B (of Detailed Description)
for i=n, n−1, . . . , n−47 {
Decode all non-zero remainders in Right_remainder[i]
Make appropriate corrections in memory
Update other remainders
Decode all non-zero remainders in Left_remainder[i]
Make appropriate corrections in memory
Update other remainders
}
Subsection C (of Detailed Description)
for each clock cycle {
Among the available remainders with non-zero indicators, choose the 8 that have the smallest remainder indices and load them into the 8 decoding pipeline.
Let max denote the maximum remainder index in the pipeline, at the output of the decoding pipeline, if the decoding of a remainder results in remainder j being updated, then
(1) If remainder j is already in the pipeline, that particular entry in the pipeline is disabled. If the updated value for remainder j is non-zero, then the corresponding indicator bit is set to 1, and the remainder will be decoded during the next pass.
(2) If remainder j is not in the pipeline, then decoder 239 distinguishes between two cases:
  (a) If j>max, and the updated value for remainder j is non-zero, then the corresponding indicator bit is set to 1, and the remainder is added to the pool of available remainders for the current pass (i.e. current iteration) of decoding.
  (b) If j<max, and the updated value for remainder j is non-zero, then the corresponding indicator bit is set to 1, but the remainder is not added to the pool of available remainders for the current pass of decoding. This remainder will be decoded in the next pass after the next OTN row is received.
}

What is claimed is:

1. A method of decoding comprising:
receiving a current sequence of bits from a communication network;
checking for errors in a plurality of codewords grouped into multiple groups;
wherein each codeword has a first set of said bits comprised within the current sequence and a second set of said bits comprised in a plurality of past sequences that are received from the communication network prior to receipt of the current sequence;
wherein each codeword in a group has no bit in common with another codeword in said group;
wherein each codeword in said group has a bit in common with another codeword in another group;
wherein the first set and the second set together comprise message bits and parity bits of said each codeword; and
storing in memory, a result obtained at least partially based on said checking.

2. The method of claim 1 wherein:
the communication network comprises an optical network;
the sequences are comprised in frames obtained by demodulating a signal of light received from the optical network; and
each row of a frame among said frames comprises a sequence among said sequences.

3. The method of claim 1 wherein:
the first set of said each codeword has multiple bits in common with second sets of codewords received later from the communication network.

4. The method of claim 1 wherein:
said parity bits are comprised in said first set of said each codeword.

5. The method of claim 1 wherein:
the parity bits are located in a group of columns central to a two-dimensional array used to access said bits in said current sequence;
the group of columns are sandwiched in said array, between two groups of outermost columns thereof comprising the message bits.

6. The method of claim 1 wherein:
the current sequence is accessed as an array of columns and rows, with bits in the array being received from the communication network one column after another column; and
the bits of the first set are comprised in a single row of the array.

7. The method of claim 6 wherein:
the array comprises a left group of columns and a right group of columns; and
during said receiving, receipt of columns in the current sequence alternates between a column in the left group and a column in the right group.

8. The method of claim 7 wherein:
a right-most column in the left group and a left-most column in the right group are received after receipt of a left-most column in the left group and a right-most column in the right group.

9. The method of claim 1 further comprising:
using locations of said errors in a currently decoded codeword to determine a plurality of remainders of additional codewords that intersect with said currently decoded codeword at said locations;
counting a number of said remainders that are equal to zero, for said additional codewords;
checking if said number satisfies a predetermined condition; and
when the predetermined condition is satisfied correcting said errors and when the predetermined condition is not satisfied skipping said correcting.

10. The method of claim 1 further comprising:
using locations of said errors in a currently decoded codeword to determine a plurality of remainders of additional codewords that intersect with said currently decoded codeword at said locations;
checking if a first remainder in said plurality of remainders is not present in any of a plurality of constituent decoders;
wherein said plurality of constituent decoders perform said checking of the plurality of codewords; and when a first result of said checking is false, disabling use of said first remainder by one of said constituent decoders.

11. The method of claim 10 further comprising:
when said first result is true, further checking whether a first index of said first remainder is greater than a largest index of any codeword currently being decoded; and
when a second result of said further checking is true and said first remainder after update is non-zero, adding said first remainder after update to a pool of remainders for decoding.

12. The method of claim 11 further comprising:
when said second result is false and said first remainder after update is non-zero, marking said first remainder after update as being available for decoding in the next iteration of decoding.

13. A non-transitory computer-readable storage medium comprising:
instructions to one or more processors to receive a current sequence of bits from a communication network;
instructions to the one or more processors to check for errors in a plurality of codewords that are grouped into multiple groups;
wherein each codeword has a first set of said bits comprised within the current sequence and a second set of said bits comprised in a plurality of past sequences that are received by execution of said instructions prior to receipt of the current sequence;
wherein each codeword in a group has no bit in common with another codeword in said group; and
wherein each codeword in said group has a bit in common with another codeword in another group;
wherein the first set and the second set together comprise message bits and parity bits of said each codeword; and
instructions to the one or more processors to store in memory coupled thereto, a result obtained at least partially based on execution of said instructions to check.

14. A circuit comprising:
means for receiving a current sequence of bits from a communication network;
means for checking for errors in a plurality of codewords that are grouped into multiple groups;
wherein each codeword has a first set of said bits comprised within the current sequence and a second set of said bits comprised in a plurality of past sequences that are received by execution of said instructions prior to receipt of the current sequence;
wherein each codeword in a group has no bit in common with another codeword in said group; and
wherein each codeword in said group has a bit in common with another codeword in another group;
wherein the first set and the second set together comprise message bits and parity bits of said each codeword; and
means for storing in memory, a result obtained at least partially by operation of said means for checking.

15. A method of encoding comprising:
in a processor,
using a current word of bits in a sequence to update, based on a concurrent code, at least one of several storage elements in an initial set;
wherein the initial set is one of several sets included in one group of storage elements;
shifting all bits in the current word cyclically to obtain a cyclically-shifted current word;
using the cyclically-shifted current word to update one of several storage elements in another set;
wherein said another set is another one of several sets included in another group of storage elements; and
repeating said usings and said shiftings with additional words occurring in said sequence subsequent to said current word.

16. The method of claim 15 further comprising:
forming a first new word using a number of bits of each of the storage elements in the initial set; and
transmitting to a communication network, at least the first new word as parity.

17. The method of claim 16 further comprising:
shifting all bits in the first new word cyclically to obtain a cyclically-shifted first new word; and
using the cyclically-shifted first new word to update at least one of several storage elements in said another set.

* * * * *